(12) United States Patent
Suzuki et al.

(10) Patent No.: US 7,764,136 B2
(45) Date of Patent: Jul. 27, 2010

(54) MICROWAVE TRANSMISSION LINE INTEGRATED MICROWAVE GENERATING ELEMENT AND MICROWAVE TRANSMISSION LINE INTEGRATED MICROWAVE DETECTING ELEMENT

(75) Inventors: Yoshishige Suzuki, Ibaraki (JP); Shinji Yuasa, Ibaraki (JP); Akio Fukushima, Ibaraki (JP); Ashwin Tulapurkar, Menlo Park, CA (US)

(73) Assignee: Japan Science and Technology Agency, Saitama (JP)

( * ) Notice: Subject to any disclaimer, the term of this patent is extended or adjusted under 35 U.S.C. 154(b) by 256 days.

(21) Appl. No.: 11/886,083

(22) PCT Filed: Mar. 17, 2006

(86) PCT No.: PCT/JP2006/305379

§ 371 (c)(1),
(2), (4) Date: Sep. 11, 2007

(87) PCT Pub. No.: WO2006/101040

PCT Pub. Date: Sep. 28, 2006

(65) Prior Publication Data

US 2008/0150643 A1    Jun. 26, 2008

(30) Foreign Application Priority Data

Mar. 18, 2005  (JP) ............................. 2005-080043
Mar. 14, 2006  (JP) ............................. 2006-069533

(51) Int. Cl.
*H03K 3/313* (2006.01)
*H01L 29/82* (2006.01)

(52) U.S. Cl. ............... 331/107 SL; 331/94.1; 331/107 T; 257/421; 324/76.14

(58) Field of Classification Search .................. 331/86, 331/89, 107 DP, 107 SL, 107 T, 187, 96, 331/94.1; 257/421; 324/236, 237, 238, 76.14, 324/76.56, 316; 428/811.1
See application file for complete search history.

(56) References Cited

U.S. PATENT DOCUMENTS 3,895,312 A * 7/1975 Tipon .......................... 331/18

(Continued)

FOREIGN PATENT DOCUMENTS

JP    2003-318465    4/2002

(Continued)

OTHER PUBLICATIONS

Rippard et al., "Current-driven microwave dynamics in magnetic point contacts as a function of applied field angle", Sep. 27, 2004, Physical Review B, vol. 70, Issue 10, pp. 100406-1 to 100406-4.*

(Continued)

*Primary Examiner*—Robert Pascal
*Assistant Examiner*—Ryan Johnson
(74) *Attorney, Agent, or Firm*—Stites & Harbison PLLC; Juan Carlos A. Marquez, Esq.

(57) ABSTRACT

A strip line integrated microwave generating element and a microwave detecting element comprises a signal electrode and a ground electrode. The element has a magnetic tunnel junction structure which includes a magnetization fixed layer, a MgO tunnel barrier layer, and a magnetization free layer. The magnetization free layer is 200 nm square or smaller in a cross-sectional area. The magnetization fixed layer is in contact with either one of the signal electrode and the ground electrode while the magnetization free layer of the element being in contact with the other. The element is smaller than the electrodes and mounted on a part of the signal electrode or the ground electrode. A MR ratio of the element is of 100% or more. A resistance value of the element is from 50Ω to 300Ω. The resistance of the element is matched with an impedance of the microwave transmission line.

7 Claims, 12 Drawing Sheets

U.S. PATENT DOCUMENTS

| | | | |
|---|---|---|---|
| 6,756,128 B2 * | 6/2004 | Carey et al. | 428/811.1 |
| 7,220,498 B2 * | 5/2007 | Nagahama et al. | 428/811.1 |
| 2003/0053265 A1 * | 3/2003 | Terunuma et al. | 360/322 |
| 2004/0144995 A1 | 7/2004 | Nagahama et al. | |
| 2005/0036244 A1 * | 2/2005 | Carey et al. | 360/324.12 |
| 2007/0285184 A1 * | 12/2007 | Eyckmans et al. | 331/107 R |

FOREIGN PATENT DOCUMENTS

| | | |
|---|---|---|
| JP | 2004-312566 | 4/2003 |
| JP | 2005-025831 | 6/2003 |

OTHER PUBLICATIONS

Tsoi et al., "Generation and detection of phase-coherent current-driven magnons in magnetic layers", Jul. 6, 2000, Letters to Nature, vol. 406, pp. 46-48.*

International Search Report of PCT/JP2006/305379 mailed Jun. 6, 2006.

Y. Suzuki et al., "Microwave Properties of Spin Injection Devices", Bulletin of Topical Symposium of the Magnetics Society of Japan, Jan. 30, 2006, pp. 49-55, and 3 pages of English translation.

S. I. Kiselev et al., "Microwave Oscillations of a Nanomagnet Driven by a Spin-Polarized Current", 2003 Nature Publishing Group, Letters to Nature, pp. 380-383.

A. A. Tulapurkar et al., "Spin-Torque Diode Effect and Magnetic Tunnel Junctions", Nature, vol. 438, No. 7066, Nov. 17, 2005, pp. 339-342.

Crystek Microwave, A Division of Crystek Corporation, "Voltage Controlled Oscillator-VCO, CVCO55BH-5450-5550", specification 2 pages, Mar. 19, 2008.

* cited by examiner

MICROWAVE TRANSMISSION LINE INTEGRATED MICROWAVE GENERATING ELEMENT AND MICROWAVE TRANSMISSION LINE INTEGRATED MICROWAVE DETECTING ELEMENT

TECHNICAL FIELD

The present invention relates to an element capable of generating a microwave and an element capable of detecting a microwave.

BACKGROUND ART

As operation speed of electronic devices become increasingly faster, an important issue is how to achieve higher integration (miniaturization) and higher efficiency in circuits handling microwaves (frequencies above the 1 GHz band). One typical example of a microwave oscillating source is the Gunn oscillator. The Gunn oscillator has the advantages of being able to operate at low voltages, and of having a high oscillation spectral purity (i.e., the percentage of frequency components outside the desired oscillation frequency is small). The Gunn oscillator, however, has the disadvantages of difficulty of size reduction for structural reasons and of poor oscillation efficiency (output power/input power=1% or less). For these reasons, it is now becoming more mainstream to use a method whereby an oscillation produced by a semiconductor element such as a transistor or a PIN diode is multiplied to provide a high frequency.

Further, in microwave circuits, the improvement of oscillation (or detection) efficiency of the oscillator (or detector) is not enough; a significant problem is now being posed by the loss through transmission lines due to impedance mismatch, which is caused by the decrease in the size of microwave transmission lines (consisting of, e.g., striplines or coaxial cables) associated with the increases in frequency (namely, wavelengths become shorter as the frequencies become higher).

Various proposals have so far been made in order to improve the efficiency of coupling with transmission lines, such as an oscillation element consisting of a Gunn oscillator and a stripline that are formed in a module (Patent Document 1), and an oscillator having a semiconductor element formed on a microwave transmission line (Non-patent Document 1: a flip-chip type Gunn diode that can be fabricated on a planar substrate). None of those proposals are capable of achieving significant improvement of oscillation efficiency over conventional technologies.

Thus, the major problem of a semiconductor-element microwave oscillator results from low oscillation efficiency and impedance mismatch between the oscillator and the transmission line. In the case of oscillation by a semiconductor oscillation element, there is also the problem of frequency purity in oscillation output.

It has recently been discovered that magnetization reversal can be caused by the current in a CPP-GMR (giant magnetoresistance) element. The CPP-GMR element herein refers to a current-perpendicular-to-plane giant magnetoresistance element, where a magnetic multilayer film having a magnetization free layer, an intermediate layer, and a magnetization fixed layer is formed perpendicular to the film plane in a columnar shape such that the current flows in a direction perpendicular to the film plane. Magnetoresistance is a phenomenon in which the direction of magnetization in the magnetization free layer changes upon application of an external magnetic field, whereby the resistance value of the element is changed. It has so far been believed that resistance in a magnetoresistance element can be changed only through the application of external magnetic field to change the direction of magnetization in the magnetization free layer. Therefore, it was a new discovery that the direction of magnetization in the magnetization free layer can be changed by current alone.

Such magnetization reversal by current is based on the resonance oscillation of the spins in the magnetization free layer. It has been reported that microwaves are produced upon excitation of resonance, and that the frequencies of the microwaves vary depending on external magnetic field. In Non-patent Document 2, the generation of microwave in a CPP-GMR element consisting of the three layers of Co, Cu, and Co is reported. The oscillation frequency of the microwaves obtained in the experiment in Non-patent Document 2 was on the order of 10 GHz to 25 GHz.

It has also been reported that current injection magnetization reversal requires a minute cross-sectional area (on the order of, e.g., 100 nm×200 nm or less for the Co, Cu, and Co three-layer film, for example) such that the magnetization of the magnetization free layer can become a single magnetic domain state. Such magnetization reversal is caused by the magnetization of the magnetization free layer producing a resonance oscillation based on the spin torque produced by the flow of current. It has been reported that, even in a current region in which no magnetization reversal occurs, oscillation of microwaves (on the order of approximately 10 GHz) is taking place in the magnetization free layer due to spin torque.

Since such oscillation is based on the collective motion of the electron spins in the magnetization free layer, it is expected that essentially the Q value (an index of the sharpness of resonance in a resonance circuit) will increase. Thus, it is expected that if such resonance oscillation can be utilized as a microwave oscillation source, higher efficiency can be achieved compared with existing microwave oscillation sources.

In the following, problems associated with the detection of microwaves are discussed. For the detection of microwaves, normally the quadratic detection characteristics of a semiconductor diode are utilized. To perform detection with high efficiency, it is necessary that there be no delay in the motion of electrons within the semiconductor. For this reason, a semiconductor or a PIN diode that has high mobility is employed. While it is possible to achieve high frequencies by decreasing electron channel length (i.e. by reducing the thickness of an element), the resultant structure would be subject to an increase injunction capacitance. If the element area is reduced in order to decrease the junction capacitance, this will then result in an increase in element resistance, thereby producing the problem of a decrease in sensitivity due to impedance mismatch with the transmission line.

Furthermore, since the quadratic characteristics of a semiconductor diode greatly depend on temperature, it is difficult to obtain stable sensitivity. Thus, even if the aforementioned problems in semiconductor diode detection in the microwave region (i.e. delay in electron motion, junction capacitance, and impedance mismatch) have all been resolved, there still remain the problem of detection efficiency characteristics being limited by temperature.

Patent document 1: JP Patent Publication (Kokai) No. 2000-353920 (P2000-353920A), entitled: Gunn diode oscillator Non-patent document 1: Flip-chip type Gunn diode, Atsushi Nakagawa, Ken-ichi Watanabe, "Flip-Chip Gunn Diode," Oyo Buturi, vol. 69, No. 2 (2000), p. 182.

Non-patent document 2: S. I. Kiselev, J. C. Sankey, I. N. Krivorotov, N. C. Emley, R. J. Schoelkopf, R. A. Buhrman & D. C. Ralph, "Microwave oscillations of a nanomagnet driven by a spin-polarized current," Nature vol. 425, (2003) pp. 380.

DISCLOSURE OF THE INVENTION

Problems to be Solved By the Invention

It is an object of the invention to improve the efficiency and reduce the size of a microwave generating portion and a microwave detection portion of an electronic circuit.

Means for Solving the Problems

Generally, in a magnetoresistance element, if a number of magnetic domains (which are magnetic blocks that are considered to be single magnetizations) are formed in the magnetization free layer, the magnetization free layer is placed in a randomly magnetized state. On the other hand, when the number of the magnetic domains in the magnetization free layer of a magnetoresistance element is one or a small number, namely when the size of the magnetization free layer is on the order of 100 nm, the so-called unification of magnetic domains is caused, whereby macroscopic magnetization resonance oscillation develops. In accordance with the present invention, a microwave element is manufactured in which such macroscopic magnetization resonance oscillation is utilized.

The proportion of the magnetization free layer in which resonance oscillation of magnetization is caused need not be the entirety (100%) of the magnetization free layer. For example, the magnetization state can be varied macroscopically if resonance is achieved by 70 to 80% of the magnetization free layer, whereby sufficient performance for forming the microwave element can be achieved. The microwave element of the invention is most characterized in that based on the above principle, a minute magnetoresistance element is used such that the aforementioned unification of magnetic domains can be expected, and that such magnetoresistance element is installed directly on a microwave transmission line.

In the following, a microwave generating element that utilizes the magnetoresistance element of the invention is initially described.

In one aspect, the invention provides a microwave generating element in which a minute ferromagnetic-multilayer-film magnetoresistance element is disposed directly on a microwave transmission line, the ferromagnetic-multilayer-film magnetoresistance element being of such size that magnetization resonance oscillation is produced upon supply of current The size of the ferromagnetic-multilayer-film magnetoresistance element is such that the magnetization free layer can be subjected to unification of magnetic domains.

In the above configuration, since the minute magnetoresistance element as a microwave oscillating element is disposed directly on the microwave transmission line, the following advantages are obtained: 1) reduction in size of the apparatus; 2) elimination of loss because of no need for wires to the oscillator; and 3) improved oscillation power efficiency due to the use of magnetization resonance oscillation in the magnetization free layer of the magnetoresistance element for microwave oscillation. Such size of the element that magnetization resonance oscillation is caused depends on the material; it is generally 200 nm square or smaller in cross-sectional area and 100 nm or smaller in height.

In another aspect, the invention provides a microwave generating element comprising: a microwave transmission line having a signal electrode and a ground electrode; a minute ferromagnetic-multilayer-film magnetoresistance element disposed on the microwave transmission line, the ferromagnetic-multilayer-film magnetoresistance element being of such size that magnetization resonance oscillation is produced and yet no change is caused in the characteristic impedance of the microwave transmission line per se; and an electrode formed at a position allowing electric current to flow from the signal electrode to the ground electrode via the ferromagnetic-multilayer-film magnetoresistance element.

In this configuration, since the oscillation element disposed on the fine microwave transmission line is extremely small as compared with the size of the microwave transmission line (i.e., on the order of one-thousandths or smaller in terms of volume ratio, for example), there is no change in impedance of the original microwave transmission line (or the rate of change due to installation can be made negligible, such as on the order of one-thousandths or smaller). The former value (volume ratio) was obtained when the element size was 1 µm against the minimum stripline width (approximately 10 µm); the latter value (ratio of change) indicates that the impedance change is at negligible levels when the element is disposed on the microwave transmission line in an insulated manner.

Preferably, the size of the element is such that unification of magnetic domains is possible to some extent, such as 200 nm square or smaller in cross-sectional area in the film plane direction (i.e., cross-sectional area as seen from a direction perpendicular to the film plane); more preferably, the size is equal to or smaller than 100 nm square. In the experiments conducted in the following examples, the elements had a cross-sectional area of 150 nm×50 nm.

In order to improve the microwave generation or detection efficiency, it is desirable that the resistance value of the magnetoresistance element be equal to the impedance value of the microwave transmission line, so as to minimize the loss due to impedance mismatch at the junction between the magnetoresistance element and the microwave transmission line. The impedance value of conventionally used micro-transmission line (such as coaxial cables) ranges generally from 50Ω to 300Ω. In the case of the element of the invention, the resistance varies in accordance with the magnetoresistance ratio; therefore, at least the range of such change in resistance value preferably overlaps the aforementioned range of resistance value. Thus, the desirable range of resistance value of the magnetoresistance element is between 1Ω and 1 kΩ and more preferably between 50Ω and 300Ω.

The magnetoresistance element of the invention is characterized in that its resistance value can be set freely to some extent by adjusting the thickness of the tunnel barrier, which is the intermediate layer of the magnetoresistance element. Thus, it is possible in reality to match the resistance value of the element with the impedance value of the microwave transmission line. Therefore, it is preferable to adjust the resistance value of the element toward the impedance value of the microwave transmission line used.

The substrate on which the above microwave transmission line is formed may be comprised of a silicon substrate, a silicon substrate having a thermally oxidized film, an oxide substrate (such as magnesium oxide, sapphire, alumina, for example), a plastic substrate, a polyimide substrate, or a flexible substrate, for example. The ferromagnetic-multilayer-film magnetoresistance element may be either a current-perpendicular-to-plane giant magnetoresistance (CPP-GMR) element or a tunnel magnetoresistance (TMR) element.

Because of the direct placement of the microwave generating element consisting of a minute magnetoresistance element on the microwave transmission line, the oscillation circuit can be reduced in size. By reducing the distance between the oscillation element and the microwave transmission line, transmission loss can be minimized. Since the resonance oscillation of the magnetization free layer is utilized, the Q value, namely, oscillation efficiency and frequency purity, can be increased.

Preferably, the resistance value of the microwave generating element is matched with. the impedance of the microwave transmission line. The microwave transmission line may be either a coplanar-type (impedance from 25Ω to 100Ω) or a slotline-type (impedance from 100Ω to 1 kΩ). The matching of the resistance of the element with the impedance of the microwave transmission line enables reduction in microwave power loss.

The invention also provides a microwave transmission line integrated microwave generating element which comprises a magnetoresistance element consisting of a TMR element having MgO as a tunnel barrier. Since the TMR element having a MgO tunnel barrier has a high MR (magnetoresistance) ratio and a low impedance, the oscillation efficiency of the element can be increased.

The invention also provides a microwave transmission line integrated microwave generating element in which, in the microwave generating. element, the direction of magnetization of the magnetization free layer of the magnetoresistance element is orthogonal to that of the magnetization of the magnetization fixed layer in a plane (film plane) parallel to the two layers. Preferably, the magnetization of the magnetization free layer is at 90 degrees (i.e., orthogonal) with respect to the magnetization of the magnetization fixed layer; the oscillation efficiency can be improved when the magnetization vector of the magnetization free layer has a component orthogonal to the direction of magnetization of the magnetization fixed layer. By orienting the direction of magnetization of the magnetization free layer orthogonal to that of the magnetization of the magnetization fixed layer, resonance oscillation based on current can be facilitated and oscillation efficiency increases.

(Means Concerning Perpendicular-to-plane Magnetization Component)

When the magnetization vector of the magnetization free layer has a component perpendicular to a plane (film plane) parallel to the two layers, oscillation efficiency can be further improved by placing the vector direction at 45 degrees away from the parallel-to-plane direction toward the perpendicular-to-plane direction. Conversely, it is also possible to improve oscillation efficiency by providing the magnetization vector of the magnetization fixed layer with a component perpendicular to the plane (film plane) parallel to the two layers and providing the magnetization free layer with a magnetization vector parallel to the film plane.

The invention also provides a microwave transmission line integrated microwave oscillating element in which, in the above microwave generating element, the ferromagnetic multilayer film portion of the magnetoresistance element is made sufficiently wide, and in which the cross-sectional area of the electrode on the upper or lower end is made 200 nm square or smaller, whereby the Q value of oscillation is significantly improved. Preferably, the size of the ferromagnetic multilayer film portion is twice or more larger than the smaller electrode portion.

The invention also provides a microwave transmission line integrated microwave generating element in which, in the above microwave generating element, a substance having a high magnetic resonance frequency is used in the magnetization free layer of the magnetoresistance element, whereby the microwave generation frequency is increased. In this element, the frequency of the generated microwave becomes equal to the magnetic resonance frequency of the magnetization free layer. At the moment, cobalt, cobalt-iron, or cobalt-iron-boron, for example, is used; by using iron, the oscillation frequency can be increased by approximately two-fold of that by using cobalt, cobalt-iron, or cobalt-iron-boron. It is also possible to increase the oscillation frequency by approximately four-fold by using a ferromagnetic/nonmagnetic multilayer film (such as, Fe/Cr or Co/Cu, for example) in the magnetization free layer. Namely, by using a substance having a high magnetic resonance frequency or a ferromagnetic/nonmagnetic multilayer film in the magnetization free layer, the generated frequency can be increased.

(Means Concerning Ferrimagnetism)

As a means to increase the oscillation frequency, ferrimagnet can be used in the magnetization free layer. Ferrimagnet refers to a magnetic material of which basic structures of magnetization (sublattices) are coupled in antiparallel directions and in which the sum of the magnetizations remains as a finite value (see FIG. 13). Examples of ferrimagnet include ferrite and iron garnet. The magnetic resonance frequency of ferrimagnet is known to be higher than that of ferromagnet (such as 50 GHz or above for ferrite). By using such substance in the magnetization free layer, a microwave generating element having a higher oscillation frequency can be configured.

(Means for Lowering the Frequency)

It is also possible to lower the oscillation frequency. In the microwave generating element of the invention, the oscillation frequency is proportional to the DC bias current, and the lower limit of oscillation frequency is determined roughly by the critical current value (to be hereafter referred to as "$I_{c0}$") of current induced magnetization reversal. In other words, obtaining a small critical current value is physically equivalent to obtaining a low oscillation frequency. In order to reduce $I_{c0}$, the following methods are known.

(1) Reducing the shape magnetic anisotropy of the magnetization free layer. Specifically, the shape of the magnetization free layer is made such that the demagnetizing field in the magnetization free layer becomes uniform. Such planar shapes that the demagnetizing field becomes ideally uniform include a circle and an ellipse; the shape, however, may be square or rectangular, for example, for ease of manufacture. In this way, collective excitation motion of magnetization within the magnetization free layer is facilitated, and it becomes possible to lower the microwave detection frequency.

In order to allow the element to oscillate efficiently, the aspect ratio is preferably 3 or smaller. The "aspect ratio" herein refers to the ratio of long side to short side (or major axis to minor axis). If the aspect ratio becomes larger, the shape magnetic anisotropy in the magnetization free layer increases, thereby disadvantageously lowering the oscillation efficiency.

(2) A substance having small magnetization is used in the magnetization free layer. In this case, it is only necessary that the magnetization of the magnetization free layer as a whole becomes smaller. Therefore, the magnetization of the magnetization free layer may be reduced by, for example, providing a component distribution in the magnetization free layer; providing a multilayer structure; or providing a multilayer structure having antiferromagnetic coupling.

(3) A substance having a perpendicular-to-plane component of magnetization is used in the magnetization fixed layer and/or the magnetization free layer.

(4) A substance having small magnetic relaxation constant (damping factor) is used in the magnetic free layer.

By using any or a combination of the above methods (1) to (4), the oscillation frequency can be lowered.

(Means for Lowering the Heat Generated During Oscillation By Using a Peltier Effect)

In the microwave generating element of the invention, oscillation is produced by providing a DC bias current to the magnetoresistance element Because the element has a very small cross-sectional area, the DC bias current density becomes extremely large (at least $10^6$ A/cm$^2$). In such element, there is the danger of deterioration or destruction of the element due to heating (Joule heating) by resistance. Meanwhile, it has been reported by the present inventors that a cooling effect by current (Peltier effect) is exhibited at a metal junction (referred to as a CPP structure because of the flow of current in a direction perpendicular to the film plane) having a shape similar to the magnetoresistance element of the present invention (refer to a paper by A. Fukushima et al., Jpn. J. Appl. Phys., vol. 44, pp. L12-14).

As discussed in the above paper, in the CPP structure, a cooling effect can be expressed by a current at a CPP portion (where the element is narrowest) by selecting a particular combination of materials for the upper electrode and the lower electrode.

When the above phenomenon is applied to the magnetoresistance element of the microwave generating element of the invention, it can be expected, based on an experiment involving a gold-cobalt metal junction of a similar size, that a cooling effect of several tens of μW can be obtained when the current value is several of mA by using gold in the upper electrode and cobalt in the lower electrode (which may be the same as the magnetization fixed layer). By using such element structure, it becomes possible to improve the reliability and increase the life of the oscillation element.

The invention also provides a microwave transmission line integrated microwave generating element in which, in the above microwave generating element, a radiation plate is provided at one or both ends of the microwave transmission line as an antenna so as to facilitate the extraction of the generated microwave to the outside. The antenna may be in the form of the microwave transmission line on the same substrate extending in width. Alternatively, it may be an external antenna installed separately and connected to an end of the microwave transmission line via a connector or the like, the antennal being matched with the impedance of the microwave transmission line.

The invention also provides a microwave transmission line integrated microwave generating element in which the microwave generating element comprises means for applying an external magnetic field to the above magnetoresistance element as a means to change the microwave oscillation frequency. The device to apply the external magnetic field may consist of an electromagnet (coil) and/or a magnet (permanent magnet); it may also consist of a magnetic field (current induced magnetic field) generated by causing current to flow in a wire disposed near the element.

In addition, the invention also provides a microwave transmission line integrated microwave generating element in which the microwave generating element is provided with an electric circuit for applying a DC bias current to the above magnetoresistance element as a means for changing the microwave oscillation frequency.

The above structures may be combined in any desired way. The same applies to the following.

The invention also provides a microwave generating circuit which comprises: a microwave oscillation source which comprises the above microwave generating element; an external frequency standard as a reference signal source; a difference signal detector for detecting a difference signal between an output of the microwave oscillation source and an output of the frequency standard; and means for controlling the frequency in accordance with the difference signal. The frequency signal source may consist of a rubidium frequency standard, a high-accuracy microwave synthesizer, and the like. The frequency may be controlled by a method by which an external magnetic field is applied by a magnetic field generator, or a method by which a bias current is applied.

The high-accuracy microwave synthesizer refers to a frequency generator having an accuracy on the order of $10^{-7}$ (in a normal range of use, with a room-temperature variation of less than 10 degree and integration time of approximately 1 minute). Such generator, which is widely used in studies on physical properties using microwave, development of microwave products, and so on, is commercially produced and sold by manufacturers including Anritsu and Agilent Technologies. Their products are equipped with a terminal for the input of a higher-accuracy time base (reference frequency) so as to more highly stabilize oscillation frequency. One example of such product is a line of RF/microwave signal generators MG3690B by Anritsu.

The above microwave generating circuit may include a synchronizing means for synchronizing the oscillation frequency with an external reference signal. The synchronizing means comprises a feedback circuit for applying a negative feedback to the microwave oscillation source using the frequency control means so as to make the difference signal to be zero. In this way, the accuracy of the oscillation frequency of the microwave generating circuit can be increased up to the levels of the above external frequency standard.

In the following, the microwave detecting element is discussed.

In one aspect, the invention provides a microwave detecting element in which a minute ferromagnetic-multilayer-film magnetoresistance element of such size that magnetization resonance oscillation is produced by providing a microwave is disposed directly on a microwave transmission line. The size of the ferromagnetic-multilayer-film magnetoresistance element is such that the magnetization free layer is subjected to unification of magnetic domains.

The direct placement of the minute magnetoresistance element as the microwave detecting element on the microwave transmission line provides the following advantages: 1) Reduction in size of the apparatus; 2) Minimization of loss by wires because the length of the wires between the antenna and the detector can be minimized; and 3) Improved sensitivity can be obtained because of the use of resonance oscillation of the magnetization free layer of the magnetoresistance element for microwave oscillation. Such size of the element that magnetization resonance oscillation is caused depends on the material; generally, it is 200 nm square or smaller in cross-sectional area and 100 nm or smaller in height.

The substrate for forming the microwave transmission line on which the above microwave detecting element is disposed may consist of a silicon substrate, a silicon substrate having a thermally oxidized film, an oxide substrate (magnesium oxide, sapphire, alumina, for example), a plastic substrate, a polyimide substrate, or a flexible substrate, for example. The magnetoresistance element may be either a current-perpendicular-to-plane giant magnetoresistance (CPP-GMR) element or a tunnel magnetoresistance (TMR) element.

By thus disposing the microwave detecting element comprising the minute magnetoresistance element directly on the microwave transmission line, the detection circuit can be reduced in size. By minimizing the distance between the detection element and the microwave transmission line (or the antenna), transmission loss can be minimized. Since resonance oscillation of the magnetization free layer having a high Q value is utilized, high sensitivity can be obtained.

The invention also provides a microwave transmission line integrated microwave detecting element in which, in the above microwave detecting element, the resistance of the magnetoresistance element is matched with the impedance of the microwave transmission line. The microwave transmission line may be either a coplanar-type (impedance 25Ω to 100Ω) or a slotline-type (impedance 100Ω to 1 kΩ). Because the element resistance can be freely changed, impedance matching with the microwave transmission line can be achieved, thereby reducing loss.

The invention also provides a microwave transmission line integrated microwave detecting element in which, in the above microwave detecting element, the magnetoresistance element consists of a TMR element having a MgO tunnel barrier. The use of the TMR element (with high MR ratio and low impedance) having the MgO tunnel barrier allows the detection efficiency of the element to be improved.

The invention also provides a microwave transmission line integrated microwave detecting element in which, in the above microwave detecting element, the direction of magnetization of the magnetization free layer of the magnetoresistance element is oriented in a direction which is orthogonal to the direction of magnetization of the magnetization fixed layer in a plane (film plane) parallel to the two layers. Preferably, the magnetization of the magnetization free layer and the magnetization of the magnetization fixed layer are at 90° with each other (i.e., the directions of the two magnetizations are orthogonal to each other). When the magnetization vector of the magnetization free layer has a component orthogonal to the direction of magnetization of the magnetization fixed layer, detection efficiency can be improved. By orienting the direction of magnetization of the magnetization free layer in a direction orthogonal to that of the magnetization of the magnetization fixed layer, microwave resonance oscillation can be facilitated and the detection efficiency can be improved.

(Concerning the Perpendicular-to-plane Magnetization Component)

When the magnetization vector of the magnetization free layer has a component perpendicular to a plane (film plane) parallel to the two layers, detection efficiency can be further improved by placing the vector direction at 45 degrees away from the parallel-to-film-plane direction toward the perpendicular-to-plane direction. Conversely, it is also possible to improve detection efficiency by providing the magnetization vector of the magnetization fixed layer with a component perpendicular to the plane (film plane) parallel to the two layers and providing the magnetization free layer with a magnetization vector parallel to the film plane.

The invention also provides a microwave transmission line integrated microwave detecting element in which, in the above microwave detecting element, the ferromagnetic multilayer film portion of the magnetoresistance element is made sufficiently wide, and in which the cross-sectional area of the electrode on the upper or lower end is made 200 nm square or smaller, whereby the Q value of resonance is significantly improved. Preferably, the size of the ferromagnetic multilayer film portion is twice or more larger than the smaller electrode portion.

The invention also provides a microwave transmission line integrated microwave detecting element in which, in the above microwave detecting element, a substance having a high magnetic resonance frequency is used in the magnetization free layer of the magnetoresistance element, whereby the microwave detection frequency is increased. In this element, the frequency of microwave that can be detected becomes equal to the magnetic resonance frequency of the magnetization free layer. At the moment, cobalt, cobalt-iron, or cobalt-iron-boron, for example, is used; by using iron, the oscillation frequency can be increased by approximately two-fold of that by using cobalt, cobalt-iron, or cobalt-iron-boron. It is also possible to obtain an element of which the detection frequency is increased by approximately four-fold by using a ferromagnetic/nonmagnetic multilayer film (such as, Fe/Cr or Co/Cu, for example) in the magnetization free layer. Namely, by using a substance having a high magnetic resonance frequency, the detection frequency can be increased. Based on the experiments conducted so far, the resonance frequency is on the order of 6 to 10 GHz when cobalt-iron-boron is used in the magnetization free layer; on the other hand, when cobalt is used in the magnetization free layer, the resonance frequency ranges from 12 to 23 GHz.

(Description Concerning Ferrimagnetism)

As a means to increase the detection frequency, ferrimagnet can be used in the magnetization free layer. Ferrimagnet refers to a magnetic material of which basic structures of magnetization (sublattices) are coupled in antiparallel directions and in which the sum of the magnetizations remains as a finite value (see FIG. 13). Examples of ferrimagnet include ferrite and iron garnet. The magnetic resonance frequency of ferrimagnet is known to be higher than that of ferromagnet (such as 50 GHz or above for ferrite). By using such substance in the magnetization free layer, a microwave detecting element having a higher detection frequency can be configured.

(Means for Lowering the Detection Frequency)

It is also possible to lower the detection frequency. In the microwave detecting element of the invention, the detection frequency is proportional to the DC bias current, and the lower limit of detection frequency is determined roughly by the critical current value (to be hereafter referred to as "$I_{c0}$") of current induced magnetization reversal. In other words, obtaining a small critical current value is physically equivalent to obtaining a low detection frequency. In order to reduce $I_{c0}$, the following methods are known.

(1) Reducing the shape magnetic anisotropy of the magnetization free layer. Specifically, the shape of the magnetization free layer is made such that the demagnetizing field in the magnetization free layer becomes uniform. Such planar shapes that the demagnetizing field becomes ideally uniform include a circle and an ellipse; the shape, however, may be square or rectangular, for example, for ease of manufacture. In order to allow the element to resonate efficiently, the aspect ratio is preferably 3 or smaller. The "aspect ratio" herein refers to the ratio of long side to short side (or major axis to minor axis). If the aspect ratio becomes larger, the shape magnetic anisotropy in the magnetization free layer increases, thereby disadvantageously lowering the detection (resonance) efficiency.

(2) A substance having small magnetization is used in the magnetization free layer. In this case, it is only necessary that the magnetization of the magnetization free layer as a whole becomes smaller. Therefore, the magnetization of the magnetization free layer may be reduced by, for example, providing a component distribution in the magnetization free layer; providing a multilayer structure; or providing a multilayer structure having antiferromagnetic coupling.

(3) A substance having a perpendicular-to-plane component of magnetization is used in the magnetization fixed layer and/or the magnetization free layer.

(4) A substance having a small magnetic relaxation constant (damping factor) is used in the magnetic free layer.

By using any or a combination of the above methods (1) to (4), the detection frequency can be lowered.

(Means for Reducing the Heat Generated During Detection By Using a Current Cooling Effect)

In the microwave detecting element of the invention, the resonance frequency (frequency to be detected) can be changed by providing a DC bias current to the magnetoresistance element Because the element has a very small cross-sectional area, the DC bias current density becomes extremely large (at least $10^6$ A/cm$^2$). In such element, there is the danger of deterioration or destruction of the element due to heating (Joule heating) by resistance.

The present inventors had discovered that a cooling effect by current (Peltier effect) is exhibited at a metal junction (referred to as a CPP structure) having a shape similar to the magnetoresistance element of the present invention. In the CPP structure, a cooling effect can be expressed by a current at a CPP portion (where the element is narrowest) by selecting a particular combination of materials for the upper electrode and the lower electrode. In the magnetoresistance element of the microwave detecting element of the invention in which the above configuration is used, it is possible to obtain a cooling effect of several tens of μW when the current value is several of mA by using gold in the upper electrode and cobalt in the lower electrode (which may be the same as the magnetization fixed layer). By using such element structure, it becomes possible to improve the reliability and increase the life of the detection element.

The invention also provides a microwave transmission line integrated microwave detecting element in which, in the above microwave detecting element, a reception plate is provided at one or both ends of the microwave transmission line as an antenna so as to facilitate the efficient introduction of microwave from the outside (such as an external circuit or the surrounding environment). The antenna may be in the form of the microwave transmission line extending in width on the same substrate. Alternatively, it may be an external antenna installed separately and connected to an end of the microwave transmission line via a connector or the like, the antenna being matched with the impedance of the microwave transmission line.

The invention also provides a microwave transmission line integrated microwave detecting element in which the microwave detecting element comprises means for applying an external magnetic field to the magnetoresistance element as a means to change the microwave resonance frequency. The device to apply the external magnetic field may consist of an electromagnet (coil) and/or a magnet (permanent magnet); it may also consist of a magnetic field (current induced magnetic field) generated by causing current to flow in a wire disposed near the element.

The invention also provides a microwave transmission line integrated microwave detecting element in which the microwave detecting element is provided with an electric circuit for applying a DC bias current to the magnetoresistance element as a means for changing the microwave resonance frequency.

The invention can also provide a single-chip type electron-spin-resonance analysis module which comprises: a local microwave oscillator having the above microwave generating element and a microwave detector having the above microwave detecting element, which are disposed within the same module or on the same substrate. A possible application of this module is in the form of an on-chip type electron spin resonance analyzer. For example, by placing both the microwave oscillator and the microwave detector of the invention within the same module, it becomes possible to configure an electron spin resonance analyzer within an area of 1 millimeter square.

EFFECTS OF THE INVENTION

In the microwave generating element of the invention, the minute magnetoresistance element is disposed directly on the microwave transmission line. As a result, the following advantages are obtained: 1) Reduction of size of the apparatus; 2) Elimination of loss by the wires because of no wires between the oscillation element and the transmission line; and 3) Improved efficiency due to the use of the magnetization resonance oscillation of the magnetization free layer of the magnetoresistance element for microwave oscillation.

In the microwave detecting element of the invention, the minute magnetoresistance element is disposed directly on the microwave transmission line. As a result, the following advantages are obtained: 1) Reduction in size of the apparatus; 2) Minimization of loss by wires because the wires between the antenna and the detector can be minimized; and 3) Improved sensitivity due to the use of the magnetization resonance oscillation of the magnetization free layer of the magnetoresistance element for microwave detection.

BRIEF DESCRIPTION OF THE DRAWINGS

FIG. 13(*a*) shows ferromagnetism; FIG. 13(*b*) shows ferrimagnetism; FIG. 13(*c*) shows antiferromagnetism.

EXPLANATION OF THE REFERENCE SIGNS AND NUMERALS

A . . . microwave generating element, 1 . . . lower electrode, 3 . . . a layer forming a magnetoresistance element, 3*a* . . . magnetization fixed layer, 3*b* . . . intermediate layer, 3*c* . . . magnetization free layer, 5 . . . upper electrode, 7 . . . insulator

BEST MODE OF CARRYING OUT THE INVENTION

In the present specification, the term "microwave transmission line" refers to a circuit having a signal electrode and a ground electrode disposed via an insulator (including vacuum) so that the circuit can be regarded as a distributed constant circuit. The term refers to a wide concept, including a stripline or a slotline on a planar substrate, a coaxial cable, and a waveguide.

Figure 13:
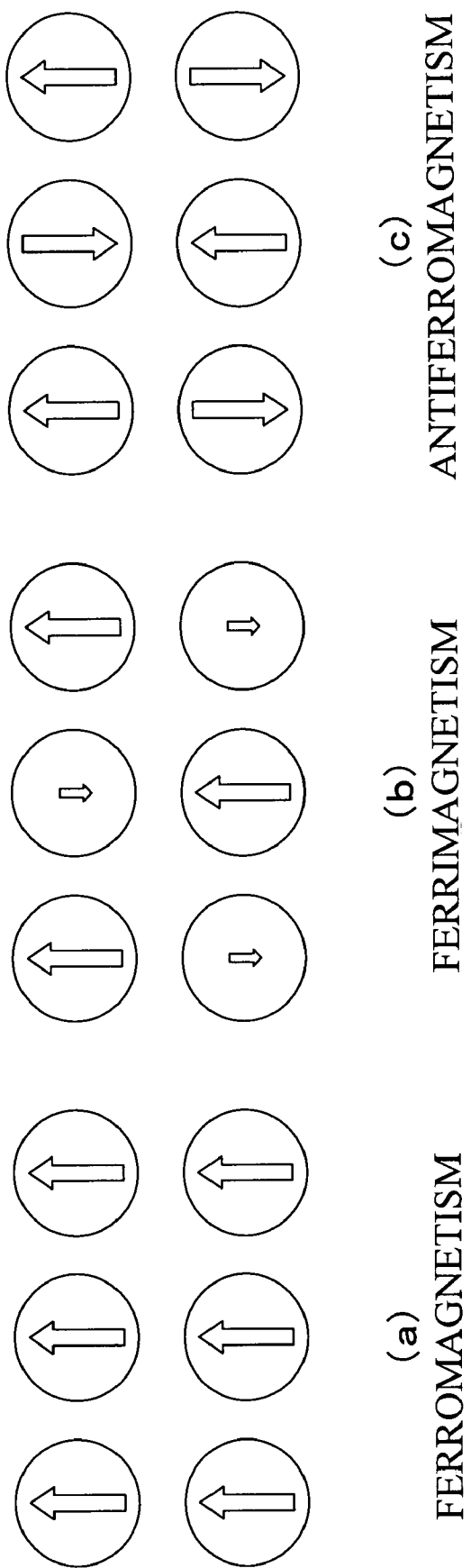
FIG. 13 shows diagrams illustrating 3 types of ferromagnets.

As a physics term, ferromagnet may refer to ferromagnet or ferrimagnet. Ferromagnet refers to a substance in which the directions of all of its spins are aligned in one direction. Examples are magnetic metals such as iron, cobalt, and nickel, and alloys such as iron-cobalt alloy and iron-nickel alloy. Ferrimagnet refers to a substance of which the spins are composed of a plurality of components (sublattices), where, although the directions of the spins in the individual components are antiparallel, their magnitudes are not uniform, resulting in a finite magnetization of the substance as a whole. Antiferromagnet refers to a substance of which the spins are composed of a plurality of components, where the directions of the spins of the individual components are antiparallel such that the magnetization of the substance as a whole is zero. An example of the spin orientation of ferromagnetism, ferrimagnetism, and antiferromagnetism is shown in FIG. 13(*a*) to (*c*). It should be noted that the ferromagnet recited in claim 1, for example, includes both ferromagnet and ferrimagnet.

The object of achieving reduction in size, improved efficiency, and reduction of mismatch with the transmission line in the oscillation and detection of microwave in an electronic circuit is achieved by the utilization of resonance oscillation of a magnetoresistance element in a microwave detecting portion of the electronic circuit, and by the direct installation of the magnetoresistance element on the microwave transmission line.

Previously, the inventors developed a TMR element having MgO as a barrier (see, e.g., S. Yuasa, T. Nagahama, A. Fukushima, Y. Suzuki & K. Ando, "Giant room-temperature magnetoresistance in single-crystal Fe/MgO/Fe magnetic tunnel junctions," Nature material vol. 3 (2004), pp. 868). As compared with a conventional CPP-GMR element or a TMR element having an alumina barrier, this TMR element having an MgO barrier has a high MR ratio of 100% or more even in low-impedance regions (i.e., regions where the resistance per 1 square micrometer area is $10\Omega$ or smaller), allowing the real resistance of the magnetoresistance element to be equal to the impedance (from $50\Omega$ to several hundred $\Omega$) of the microwave transmission line.

The inventors realized that the characteristics of a microwave generating element and a microwave detecting element can be greatly improved by placing, on a microwave transmission line having a signal electrode and a ground electrode, a ferromagnetic-multilayer-film magnetoresistance element of a minute size such that magnetization resonance oscillation is produced and such that no change is caused in the characteristic impedance of the microwave transmission line itself. For example, the efficiency of a microwave oscillator or a microwave detector can be further improved by using a TMR element having a MgO barrier with low impedance and high MR ratio as a microwave oscillation source or a microwave detecting element.

By using a minute magnetoresistance element as a microwave oscillation source or a microwave detecting element, the following features can be obtained:

1) The very small size of the element allows direct fabrication on the microwave transmission line.
2) By matching the resistance value of the element with the impedance of the microwave transmission line, the loss due to impedance mismatch between the oscillation source or the detection element and the microwave transmission line can be decreased. For this purpose, use of a TMR element having a MgO barrier with a wide variable range of the element resistance value provides better performance.
3) Since the resonance oscillation of the magnetization free layer is utilized, the Q value is essentially high. For this purpose, since output becomes larger as the MR ratio increases, use of a TMR element having a MgO barrier provides better performance.
4) The magnetization resonance frequency can be varied by an external magnetic field or a DC bias current. Namely, the oscillation frequency can be synchronized with the outside; for example, the accuracy of oscillation frequency can be stabilized up to the same level as an external signal source by configuring a phase-locked loop (PLL) circuit with a high-accuracy external signal.

EXAMPLES

Example 1

In the following, a microwave generating element and a microwave detecting element according to an embodiment of the invention are described. The present embodiment employs a ferromagnetic-multilayer-film magnetoresistance element having a structure such that current flows through a magnetization free layer/intermediate layer/magnetization fixed layer (the top-bottom positions of the magnetization free layer and the magnetization fixed layer may be reversed) formed on a substrate (such as, e.g., a columnar structure having a minute cross-sectional area perpendicular to the plane of the multilayer film). In the case of the microwave oscillating element, microwave is produced by magnetization resonance oscillation upon causing a flow of DC current. In the case of the microwave detecting element, DC voltage is produced by the detecting action of magnetization resonance oscillation upon irradiation of microwave.

First, an example of the structure of the magnetoresistance element used in the microwave generating element and the microwave detecting element of the present embodiment is described with reference to the drawings. FIG. 1A is a cross section of an example of the structure of the magnetoresistance element used for microwave generation or microwave detection in the present embodiment. FIG. 1B is a perspective view of the magnetoresistance element. As shown in FIGS. 1A and 1B, the magnetoresistance element A of the example includes: a lower electrode 1; a layer 3 formed on top of the lower electrode 1 in a columnar shape, forming the magnetoresistance element; an insulator 7 formed on top of the lower electrode 1 in such a manner as to surround the layer 3 forming the magnetoresistance element; and an upper electrode 5 formed on top of the insulator 7 and the layer 3 forming the magnetoresistance element. The layer 3 forming the magnetoresistance element includes, disposed in order from the side of the lower electrode 1; a magnetization fixed layer 3a, an intermediate layer 3b, and a magnetization free layer 3c. The order (relative positions) of the magnetization fixed layer and the magnetization free layer may be reversed. It is necessary that the magnetization free layer 3c produces resonance oscillation upon application of DC current or microwave irradiation; preferably, the magnetization free layer 3c has a thickness on the order of 1 to 5 nm. The magnetization fixed layer 3a, if made of a single material, needs to have a thickness about 10 times the magnetization free layer 3c. It is also possible to use, as the magnetization fixed layer 3a, a magnetic metal multilayer film utilizing an antiferromagnetic coupling. The portion indicated by the sign X may be filled with an insulator (such as $SiO_2$). The sign X means the same in FIGS. 2B and 4 to which reference is made below.

The magnetoresistance element used for microwave generation or microwave detection in accordance with the present example may be either a current-perpendicular-to-plane giant magnetoresistance (CPP-GMR) element or a tunneling magnetoresistance (TMR) element. The CPP-GMR element may include an intermediate layer of nonmagnetic metal such as copper, and a magnetization free layer and a magnetization fixed layer each formed of: magnetic metal such as cobalt, iron, nickel, chromium, or an alloy thereof; a magnetic alloy whose magnetization is decreased by mixing boron; or a magnetic metal multilayer film (such as, for example, a multilayer film of ferrocobalt-ruthenium-ferrocobalt) utilizing antiferromagnetic coupling.

The TMR element may have a magnetic. tunnel junction structure having a tunnel barrier layer, a first ferromagnet layer having a BCC (body-centered cubic) structure formed on a first-plane side of the tunnel barrier layer, and a second ferromagnet layer having a BCC structure formed on a second-plane side of the tunnel barrier layer. Preferably, the tunnel barrier layer is formed of a layer of single crystal $MgO_x$ (001) or polycrystal $MgO_x$ (0<x<1) with a preferred orientation in the (001) crystal plane (to be hereafter referred to as MgO layer). Preferably, the atoms of which the second ferromagnet layer is composed are disposed on the O of the MgO tunnel barrier layer. For example, the intermediate layer may consist of an insulating film (alumina or magnesium oxide (MgO)). Examples of the material for the magnetization free layer and the magnetization fixed layer include magnetic metals such as cobalt, iron, nickel, and chromium and alloys thereof; magnetic alloys whose magnetization is decreased by mixing boron; and a magnetic metal multilayer film (such as, e.g., a multilayer film of ferrocobalt-ruthenium-ferrocobalt) that utilizes antiferromagnetic coupling.

With regard to the shape of the magnetoresistance element, in order to bring about resonant motion of the magnetization free layer, the cross-sectional area (junction area) of the element is preferably smaller than 1 micron square. As to the resistance value of the element, it is preferably either $1\Omega$ or greater, or $10 k\Omega$ or smaller in terms of DC resistance value to achieve matching with the microwave transmission line.

Figure 2:
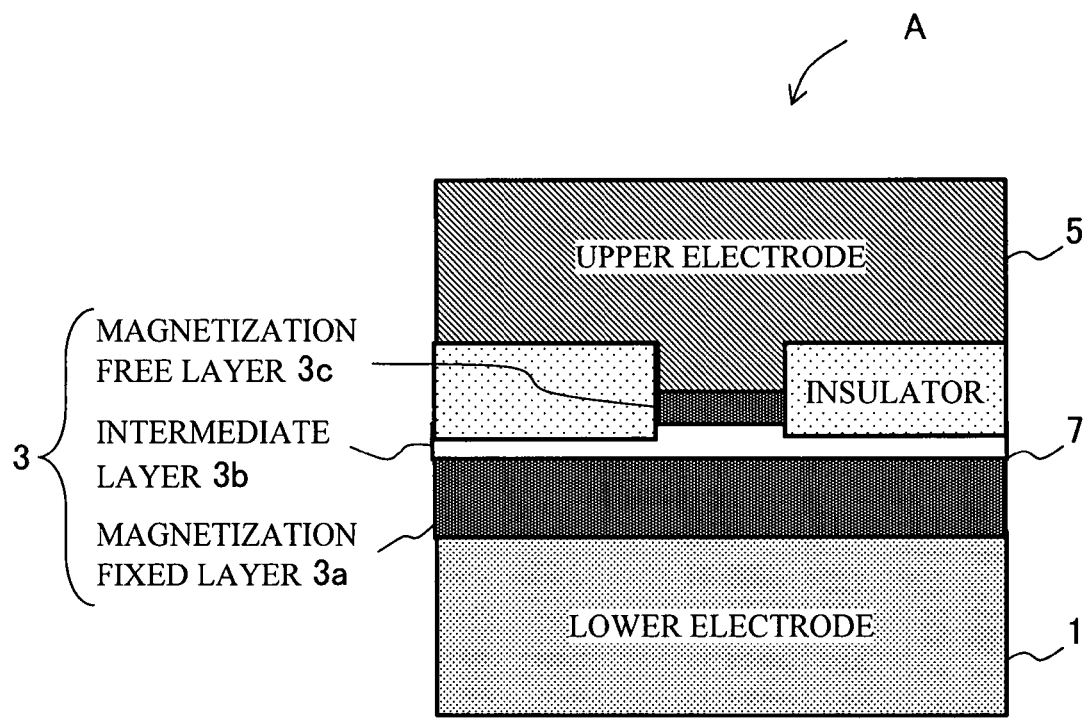
FIG. 2A shows a cross section of an example of the configuration of a magnetoresistance element used for microwave oscillation or microwave detection according to an embodiment of the invention, where etching has been conducted up to an intermediate layer.
FIG. 2B shows a perspective view of the magnetoresistance element of FIG. 2A.
Figure 2:
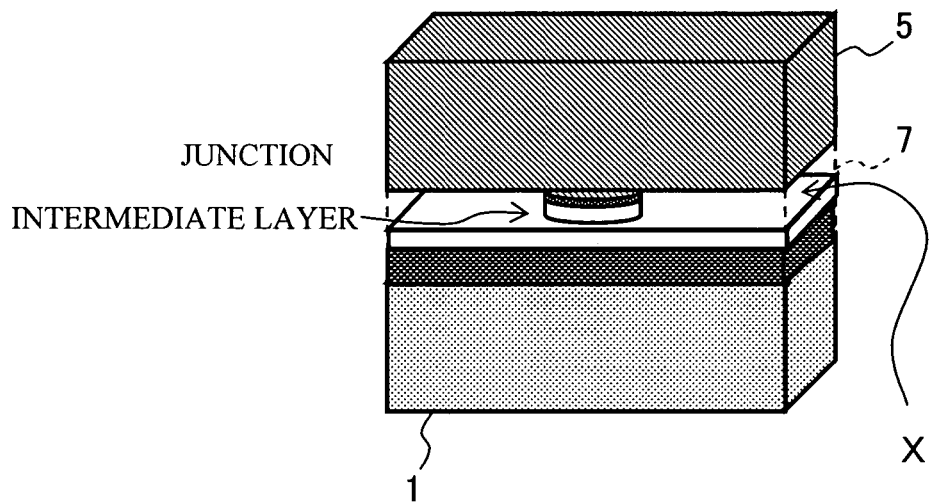

In terms of the processed shape, etching may be conducted up to the intermediate layer 3b. FIG. 2A is a cross section of an example of the structure of the magnetoresistance element used for the generation or detection of microwave according to the present embodiment in which etching has been conducted up to the intermediate layer 3b. FIG. 2B shows a perspective view of the magnetoresistance element.

If an uneven magnetic field is applied to the magnetization free layer, its uniform precessional motion is interfered and the efficiency of current induced magnetization reversal or current-induced precessional motion of magnetization (which is the phenomenon used for the oscillation and detection of microwave in the present invention) is adversely affected. Thus, it is necessary to prevent the application of uneven magnetization to the magnetization free layer as much as possible.

However, micromachining of magnetic material inevitably involves the concentration of magnetic flux at a sharp portion of the material (or an edge portion of the pattern), resulting in the creation of uneven magnetic field. Therefore, in a magnetoresistance element of three-layer structure to which the present embodiment is directed, ideally the magnetization free layer is processed in the form of a small magnet having no sharp portions, where desirably the magnetization fixed layer is an infinite plane. Namely, the film of the three-layer structure is ideally processed in a columnar shape up to immediately above the magnetization fixed layer. However, in practice, it is difficult to perform such ideal micromachining; in many cases better results are obtained by etching up to the magnetization fixed layer, as shown in FIG. 1A, rather than stopping the etching immediately above the magnetization fixed layer. Particularly, in a CPP-GMR element, the hardness of the materials used is not much different among the magnetization free layer, the. intermediate layer, and the magnetization fixed layer, so that it is difficult to stop etching at a desired depth.

In the case of a TMR element, however, since the intermediate layer is an oxide (such as magnesium oxide or aluminum oxide), which is generally harder than the material used for the magnetization free layer, etching can be stopped at the intermediate layer. Particularly, in the case of a TMR element, it is possible to realize a processed shape with higher efficiency in which etching is conducted to the intermediate layer as shown in FIGS. 2A and 2B.

Example 2

Figure 3:
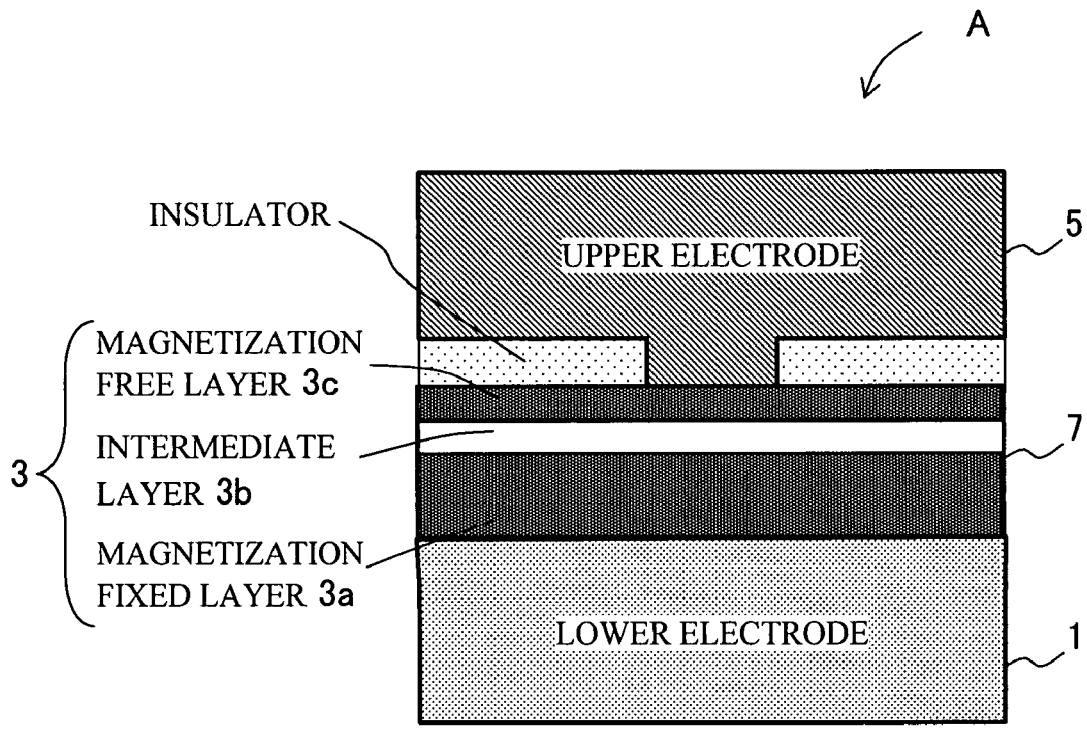
FIG. 3 shows a cross section of an example of the configuration of the magnetoresistance element used for microwave generation or microwave detection according to the present embodiment, where upper electrode is contacted through small hole in insulator layer.
Figure 4:
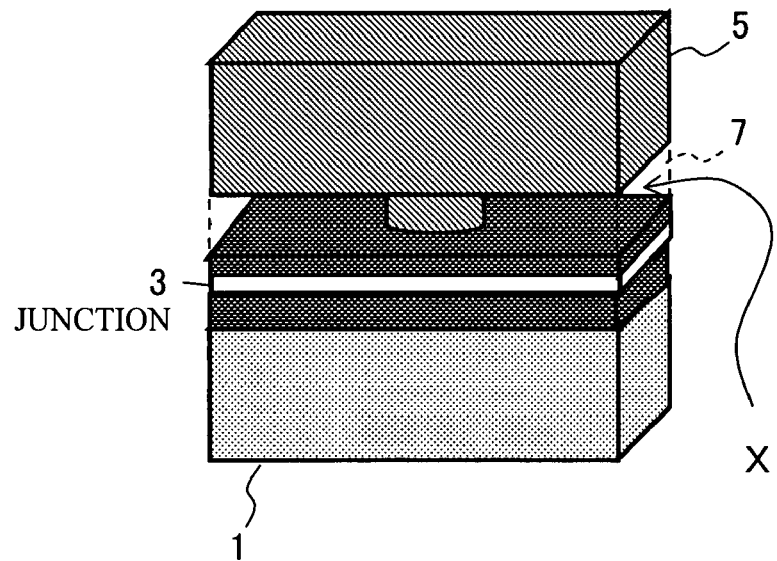
FIG. 4 shows a perspective view of the magnetoresistance element of FIG. 3.

In the following, a magnetoresistance element used as a microwave generating element or a microwave detecting element according to the present embodiment is described with reference to the drawings. This embodiment adopts a structure (referred to as a point-contact configuration) in which the upper electrode (or lower electrode) alone is reduced in size, and the electrode is in contact with a multilayer film, of which the magnetoresistance element is formed, in a minute cross-sectional area. FIG. 3 is a cross section of an example of the magnetoresistance element of the present embodiment used for microwave generation or microwave detection. FIG. 4 is a perspective view of the magnetoresistance element. While FIGS. 3 and 4 show the example in which the upper electrode alone is reduced in size in point-contact configuration, it is also possible to adopt point-contact configuration on the lower electrode side. As shown in FIGS. 3 and 4, the magnetoresistance element A of the present embodiment includes: a lower electrode 1; a layer 3 forming the magnetoresistance element; an upper electrode 5 formed on the layer 3 forming the magnetoresistance element in a columnar shape and processed in point-contact configuration; and an insulator 7 formed in such a manner as to surround the portion of the upper electrode 5 that is formed in a columnar shape. The layer 3 forming the magnetoresistance element includes, in order from the side of the lower electrode 1, a magnetization fixed layer 3a, an intermediate layer 3b, and a magnetization free layer 3c. It is required that the magnetization free layer 3c produce resonance oscillation on the basis of DC current or microwave irradiation; the layer preferably has a thickness on the order of 1 to 5 nm, for example. The magnetization fixed layer 3a, if it consists of a single material, requires a thickness of approximately 10 times or more of the magnetization free layer 3c. Alternatively, the magnetization fixed layer 3a may consist of a magnetic metal multilayer film that utilizes anti-ferromagnetic coupling. Gaps X can be filled with an insulating film of $SiO_2$ or the like.

In the above magnetoresistance element of the present embodiment that is used as a microwave generating element or a microwave detecting element, the cross-sectional area of the contact surface of the upper electrode (or lower electrode) that is processed in point-contact configuration is preferably 200 nm square or smaller. The ferromagnetic multilayer film portion of the magnetoresistance element is made sufficiently larger than the contact surface, preferably twice or more larger than the contact area.

Example 3

Figure 5:
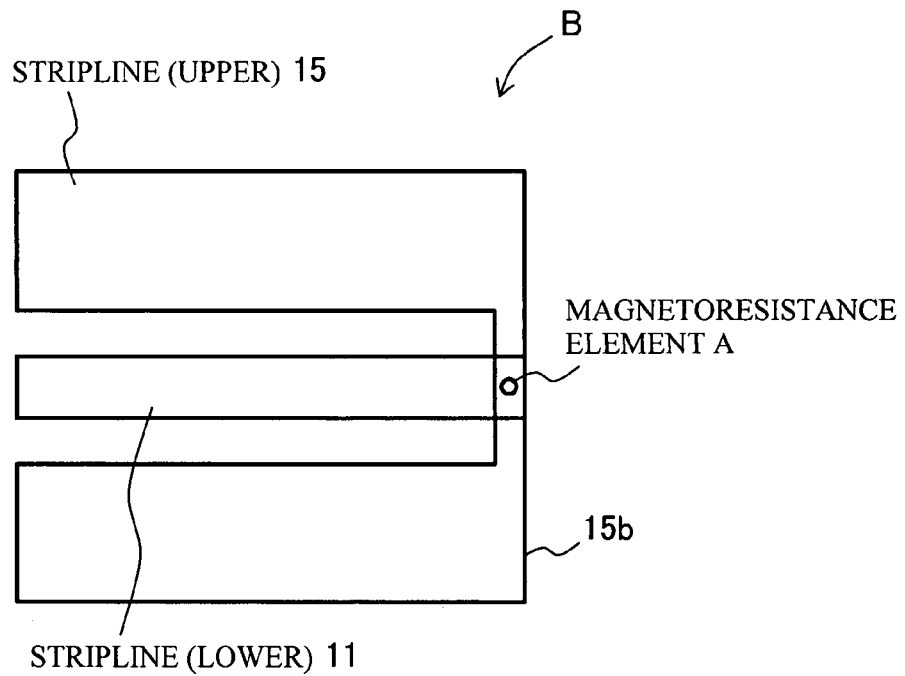
FIG. 5 shows an example where the magnetoresistance element A is disposed at an end of the microwave transmission line, which is an example where the magnetoresistance element is disposed at a short-circuit portion on one side of a coplanar-type transmission line.

In the following, an example is described in which the above magnetoresistance element is used on the microwave transmission line. In the present embodiment, the magnetoresistance element is used as a microwave oscillation source (or detection element). In this case, the magnetoresistance element may be greatly smaller than a conventional microwave transmission circuit, and may be of a size smaller than 1 micron square, for example. Therefore, as shown in FIG. 5, by placing the magnetoresistance element A between a lower stripline 11 and an upper stripline 15, the element can be installed directly at the end of the microwave transmission line. In this case, the lower stripline 11 and the upper stripline 15 are electrically connected to each other via the magnetoresistance element alone. While in the example of FIG. 5 the magnetoresistance element is disposed on a coplanar-type stripline as the microwave transmission line, a slotline-type stripline may also be used. Preferably, in this case too, the magnetoresistance element is disposed between the lower stripline and the upper stripline, and the striplines are electrically connected via the magnetoresistance element alone.

Furthermore, while the example of FIG. 5 has the magnetoresistance element B disposed at the end of the coplanar-type stripline, the coplanar-type stripline may be provided with a portion at the center thereof where a ground pattern and a signal pattern intersect each other while electrically insulated from each other, and they may be electrically connected to each other at such intersection via the magnetoresistance element alone.

Figure 6:
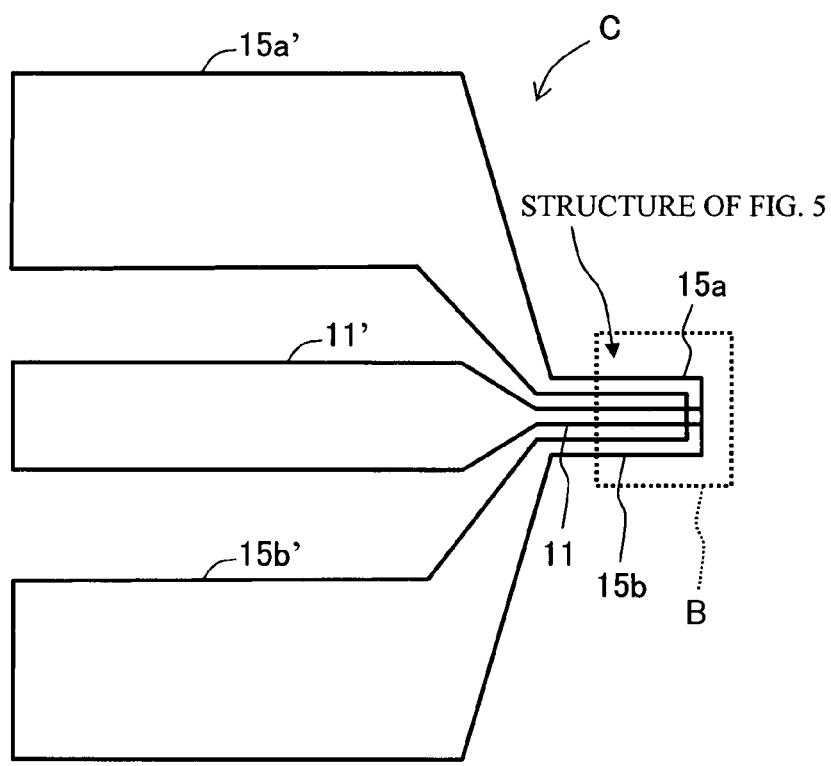
FIG. 6 shows an example of application of a microwave transmission line integrated microwave oscillating element according to the present embodiment, where one side of the coplanar-type transmission line is extended to function as an antenna

FIG. 6 shows an application of the microwave transmission line of the present embodiment. As shown in FIG. 6, it is possible to extend the striplines of the microwave transmission line of FIG. 5 widely towards one side to make them function as an antenna. Specifically, the striplines 11, 15a, and 15b of the structure of FIG. 5 (the area B of dotted line) are extended widely toward one side, as shown by reference numerals 11', 15a', and 15b'.

Example 4

In the following, an experiment concerning microwave detection with a TMR element having a MgO tunnel barrier is described with reference to FIGS. 7 and 8. The TMR element having the MgO tunnel barrier is an element fabricated on a coplanar-type stripline on a thermally-oxidized silicon substrate. Cobalt-iron-boron was used in the magnetization free layer and the magnetization fixed layer. The cross-sectional area of the TMR element was 70 nm×200 nm.

Figure 7:
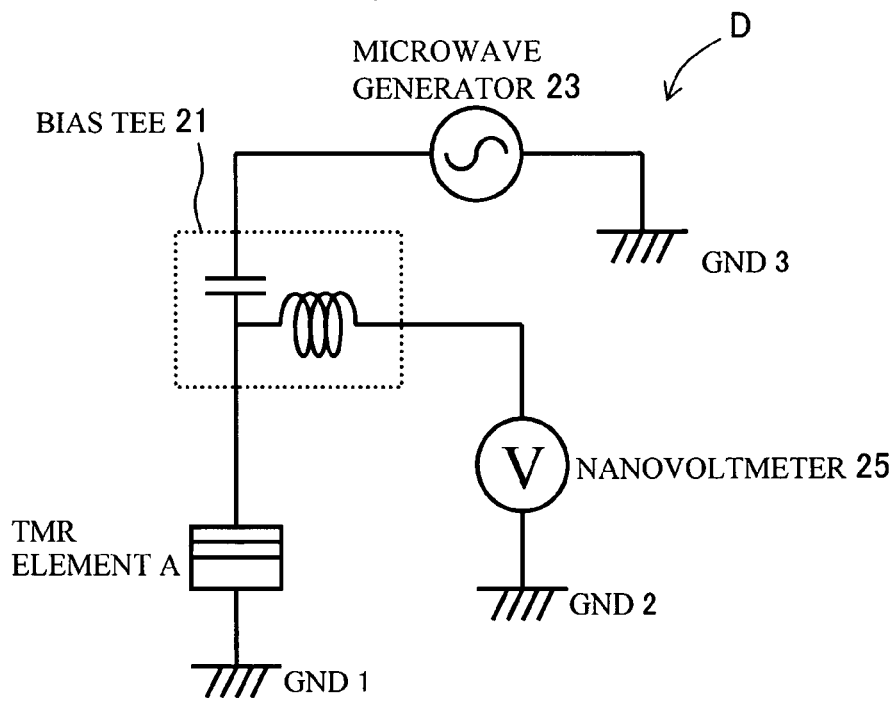
FIG. 7 shows an example of the circuit configuration of an experimental circuit regarding the microwave transmission line integrated microwave detecting element according to the present embodiment.

FIG. 7 shows an example of the circuit configuration of the experimental circuit. As shown in FIG. 7, the experimental circuit of the present embodiment comprises a microwave detecting element D. The microwave detecting element D has a TMR element A, which has a MgO tunnel barrier, fabricated on a microwave transmission line. The microwave detecting element is connected with a microwave generator 23 via a bias tee 21. (The bias tee is a microwave circuit element consisting of a terminal to which a capacitor is connected in series, a terminal to which an inductor is connected in series, and a terminal consisting only of a wire for connection of an external microwave circuit, where the terminals are connected in a three-way branch (T) shape. The terminal to which the capacitor is connected allows the passage of only high frequency component including microwave component. The terminal to which the inductor is connected allows the passage of only low frequency component including DC component. Utilization of such characteristics make it possible to separate a signal from the external microwave element into microwave component and DC component.) The microwave generator 23 provides a microwave whose frequency is swept. The detected component (DC voltage signal) produced in the microwave detecting element D (i.e., the TMR element A formed on the microwave transmission line, which has the MgO tunnel barrier) can then be measured with a nanovoltmeter 25 connected to the inductor terminal of the bias tee 21. In the drawing, GND 1 to GND 3 (zero potential points) are noted at three locations; this, however, is for the sake of convenience, and they do not necessarily have to have zero potential if they are given the same potential.

Figure 8:
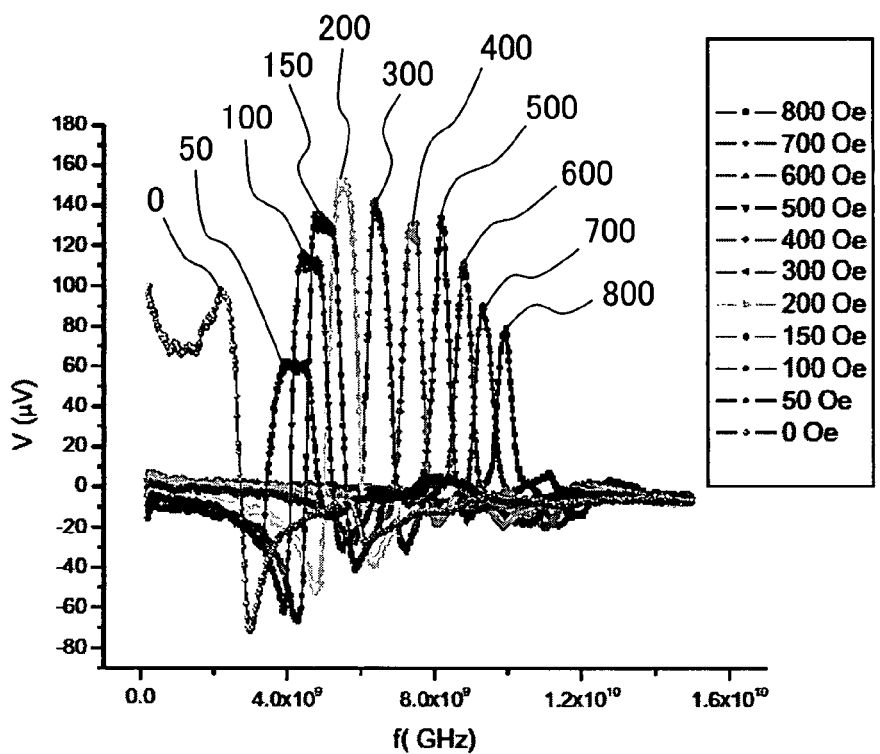
FIG. 8 shows the results of irradiating a TMR element with a microwave of 0.2 to 20 GHz using the measurement circuit of FIG. 7, and then measuring, with a bias tee (a type of high-frequency branching circuit), a detection output (DC voltage) based on resonance oscillation due to the microwave irradiation, indicating the relationship between microwave frequency and output voltage.

FIG. 8 shows the results of irradiating the TMR element A having the MgO tunnel barrier with a microwave (frequency f) of 0.2 to 20 GHz and measuring, with the measurement circuit of FIG. 7, the DC offset voltage (V) obtained by the bias tee 21 of FIG. 7 on the basis of the resonance oscillation caused by microwave irradiation. It can be seen from this experiment that the resonance frequency can be varied from 4 to 10 GHz by providing an external magnetic field (0 to 800 Oe).

In the case of this experiment, a maximum DC voltage output of 120 µV is obtained against an input power of −15 dBm (with an amplitude of about 50 mVp-p at 50Ω). When this result is considered in terms of the sensitivity of a detector, since it is well within the current state of the art of measurement to obtain an accuracy of 10 nV/(Hz)$^{1/2}$ in DC voltage measurement, the element used in the experiment has the capacity to measure input voltage (microwave energy) at the accuracy of $10^{-4}$ at resonance frequency. Such accuracy values indicate a very high sensitivity for a measurement method that does not involve a low-noise preamplifier.

In the element of the present embodiment, since the resonance oscillation of electrons in the magnetic metal is utilized in the microwave resonance body, the Q value can be essentially increased. Although the current Q value is approximately 15, as shown in FIG. 8, it is possible to increase the Q value to the level of a crystal oscillator (Q value in excess of 10,000), for example, by fabricating the element having a single crystal metal, i.e., single crystal tunnel barrier. In this case, the sensitivity of the detector can be increased by approximately three orders of magnitude.

Furthermore, as shown in FIG. 8, it can be seen that the resonance frequency (frequency of peak voltage) varies substantially linearly with respect to the external magnetic field. Therefore, it is possible, as an example of application of the detector, to obtain the frequency distribution of microwave as the measurement target directly by sweeping the external magnetic field while the element of the present embodiment is irradiated with microwave of an unknown frequency. This means that the detection element itself is provided with a bandpass filter function. Thus, the present embodiment has the advantage that frequency distribution can be directly obtained by varying the resonance frequency of the element itself from the outside, rather than on the basis of a combination of a frequency filter and a detector, as in conventional spectrometers.

Example 5

Figure 9:
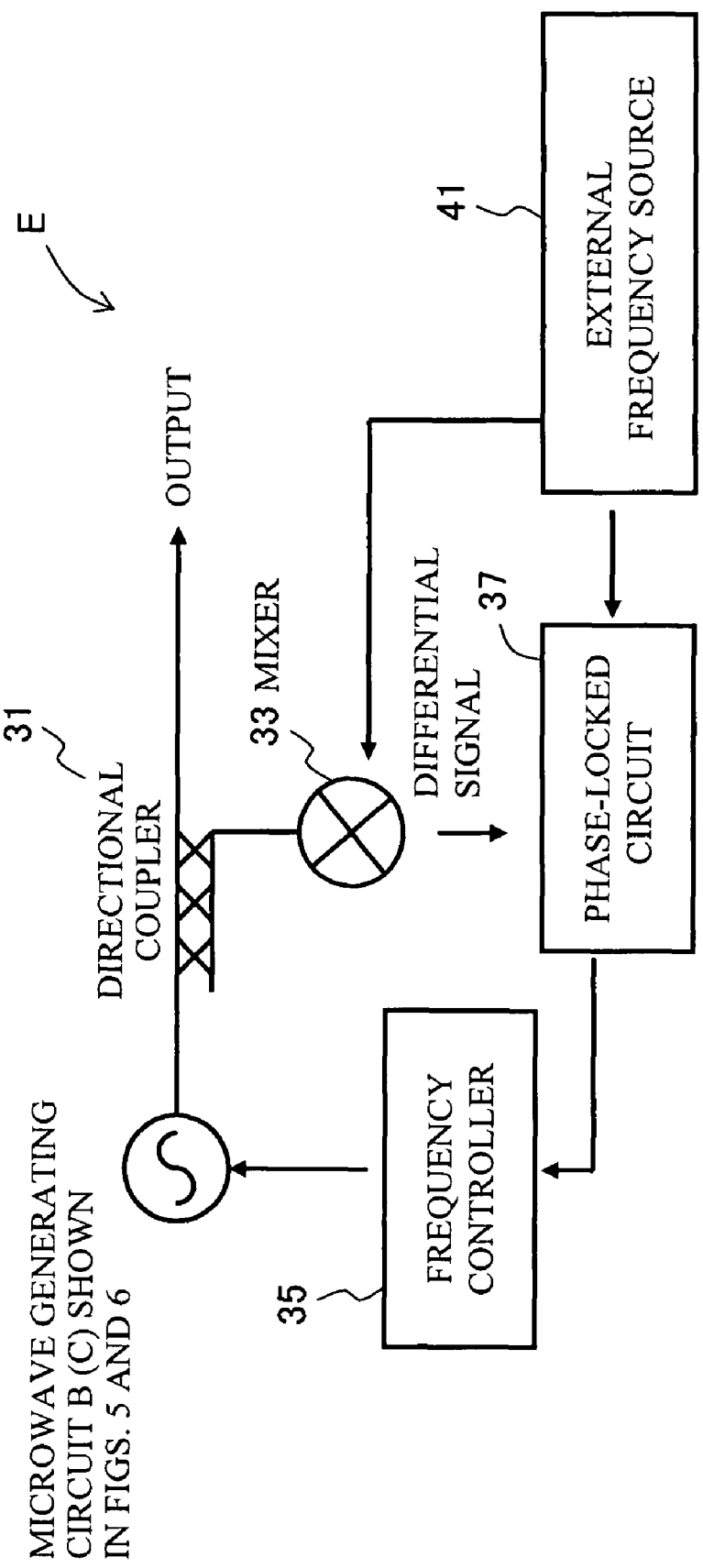
FIG. 9 shows an example of application of the microwave oscillating element according to the present embodiment in an oscillation circuit that can be synchronized with an external reference frequency source.

In the following, a microwave oscillator is described which comprises the microwave oscillating element of the present embodiment and which can be synchronized with an external reference frequency. With reference to FIG. 9, the microwave oscillating element of the present embodiment is described, which is an application of the microwave oscillating element of the present embodiment in a circuit which can be synchronized with an external reference frequency source. The microwave oscillating element of the present embodiment is characterized in that the oscillation frequency can be changed by an external magnetic field or a bias DC current. By utilizing this feature, the microwave oscillation frequency can be synchronized with an external reference frequency. As shown in FIG. 9, a directional coupler 31 is connected to the output terminal of the microwave oscillating circuit B (or C) of the present embodiment so as to branch out a microwave output without any influence on the output side. The thus branched output is multiplied by a signal from an external reference frequency source 41 by means of a mixer 33 to obtain a difference signal. The difference signal is then fed to a phase locked circuit 37. Feedback is provided by a frequency control unit 35 such that the output of the phase locked circuit 37 becomes a set value (such as zero). The microwave oscillation frequency can be synchronized with the external reference frequency. Accuracy of the frequency can be improved.

For example, by using, as the external reference frequency source 41, a rubidium atomic frequency source (or a reference frequency obtained by multiplying or dividing the frequency from such source), it becomes possible to realize, using the microwave oscillating element of the invention, a microwave oscillation source having an accuracy equivalent to the accuracy of the atomic clock.

The rubidium frequency standard is a frequency standard of very high accuracy levels (i.e., a device for generating a specific frequency with high accuracy) having an accuracy of $10^{-10}$ or less. Specifically, such standard is used for maintaining the carrier frequency of television or radio broadcast. One example of the rubidium frequency standard in product form is the Model 3271 (10 MHz reference signal generator) from Japan Communication Equipment (Nitsuki) Co., Ltd.

Example 6

Figure 10:
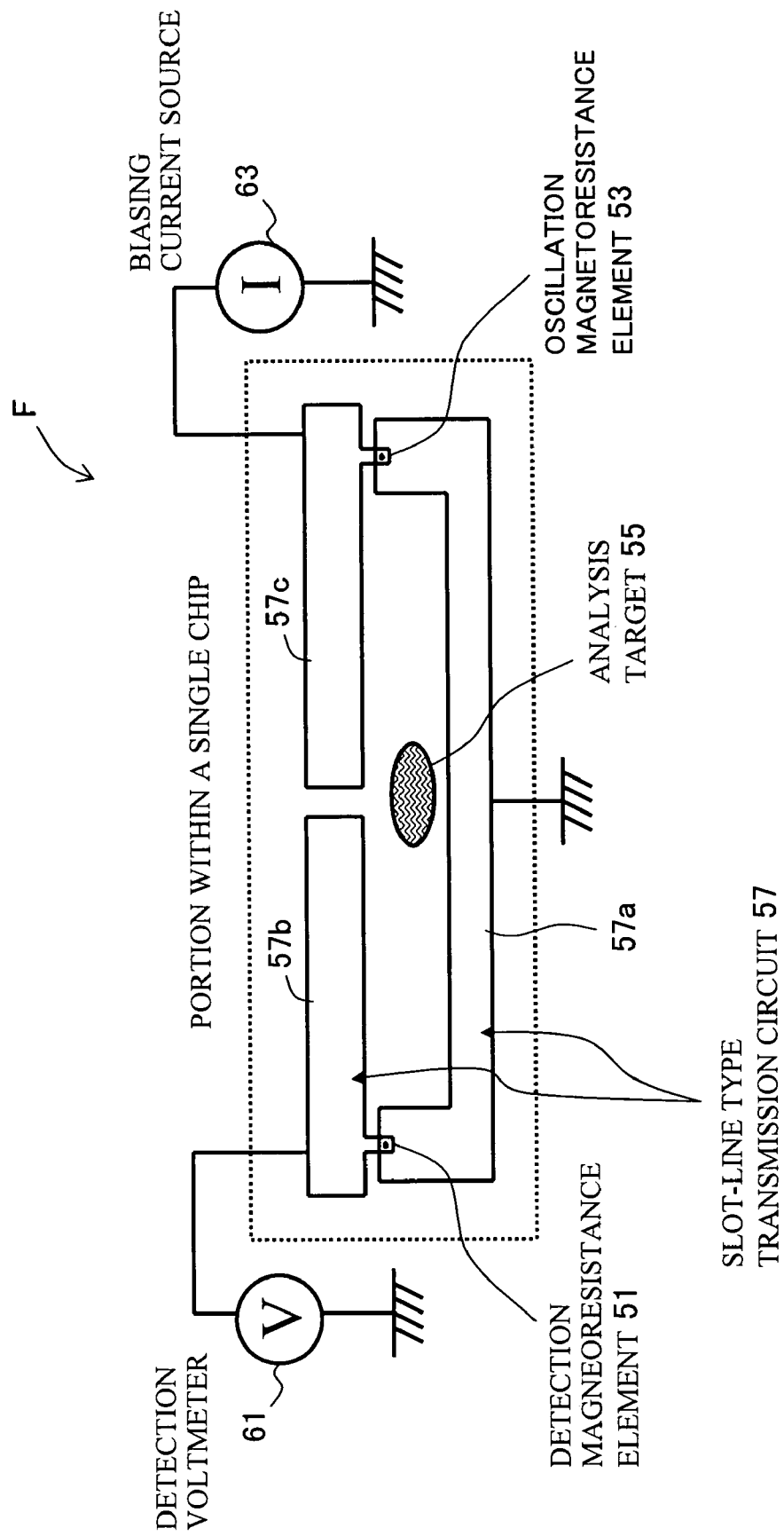
FIG. 10 shows an example of the configuration of an on-chip type electron spin resonance analyzer combining the microwave oscillating element and the microwave detecting element of the present embodiment, indicating an example of an electron spin resonance analysis module using a magnetoresistance element on the transmission line.

In the following, an application in an on-chip type electron spin resonance analyzer is described with reference to the drawings. FIG. 10 shows a configuration of the on-chip type electron spin resonance analyzer (module) comprising a combination of the microwave oscillating element and the microwave detecting element of the present embodiment, in which a magnetoresistance element is used on the transmission line. As shown in FIG. 10, the microwave oscillating element (including a microwave oscillating magnetoresistance element 53) of FIG. 6 having an antenna, and the microwave detecting element (including a microwave detection magnetoresistance element 51) of also FIG. 6 having an antenna are disposed face to face with each other. A ground plane portion 57*a* may be shared by the microwave oscillating element and the microwave detecting element; it is necessary, however, that electrically conducting portions 57*b* and 57*c* of the oscillating portion and the detecting portion are electrically insulated from each other. To the conducting portions 57*b* and 57*c* of the oscillating portion and the detecting portion, a detection voltmeter 61 and a bias current source 63 are connected, respectively. In the example of FIG. 10, a slotline-type microwave transmission line 57 is used; other types of microwave transmission line, such as a coplanar-type microwave transmission line, may also be used.

A sample 55 to be detected (analysis target) is disposed at the center portion (where the microwave propagates) of the slotline-type microwave transmission line 57, and microwave is oscillated by the microwave oscillation circuit. In the sample 55 to be detected, the energy of microwave transmitted to the detection portion decreases upon resonance with the oscillated microwave. By taking advantage of this, the electron spin resonance frequency of the sample to be detected can be measured.

Conventionally, electron spin resonance measurement required large-scale equipment for both the oscillation circuit and the detection circuit. In accordance with the present embodiment, both the microwave oscillating element and the microwave detecting element can be formed within an extremely small area (such as 1 cm square or smaller, for example) on-chip. Furthermore, because the analyzer per se can be reduced in size, the amount of the sample to be detected as a measurement target can be advantageously made very small (such as on the order of microgram or less).

Thus, the present embodiment provides the advantage of improving the efficiency of an electronic-material measuring device using microwave, reducing its size, and saving of energy.

Example 7

Figure 1:
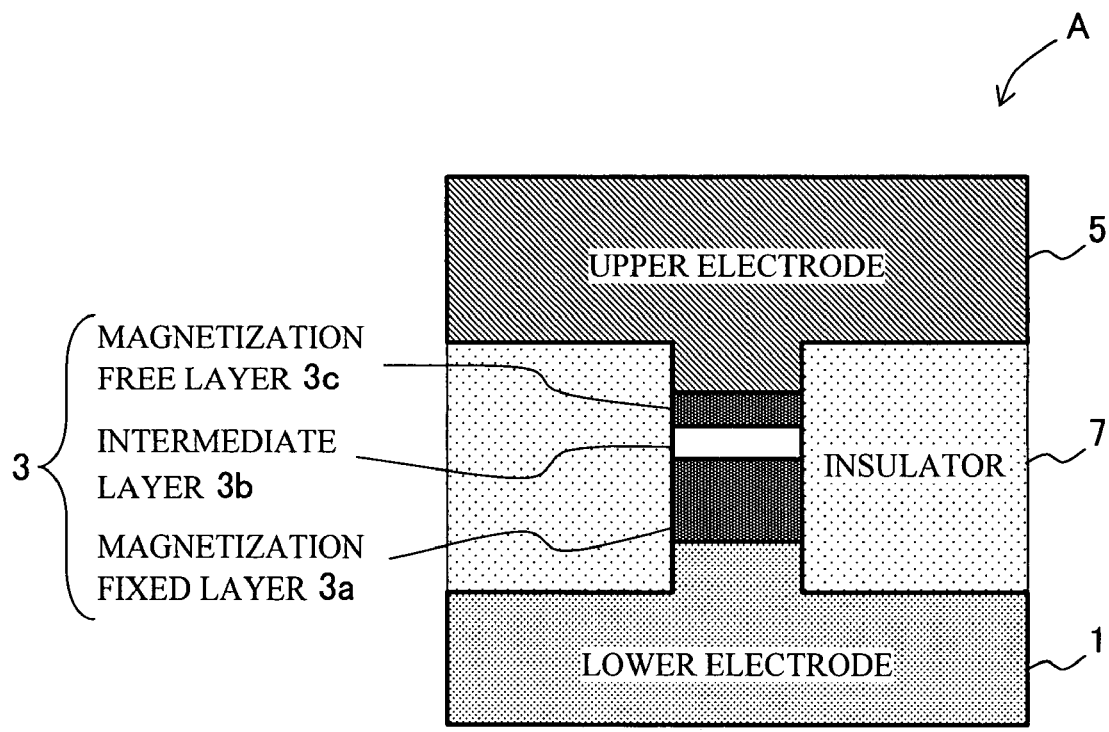
FIG. 1A shows a cross section of an example of the configuration of a magnetoresistance element used for microwave oscillation or detection according to an embodiment of the invention.
FIG. 1B shows a perspective view of the magnetoresistance element of FIG. 1A.
Figure 1:
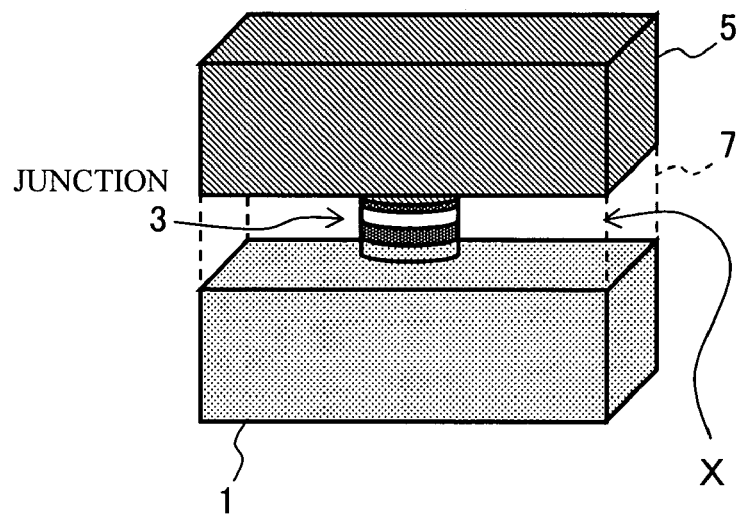
Figure 11:
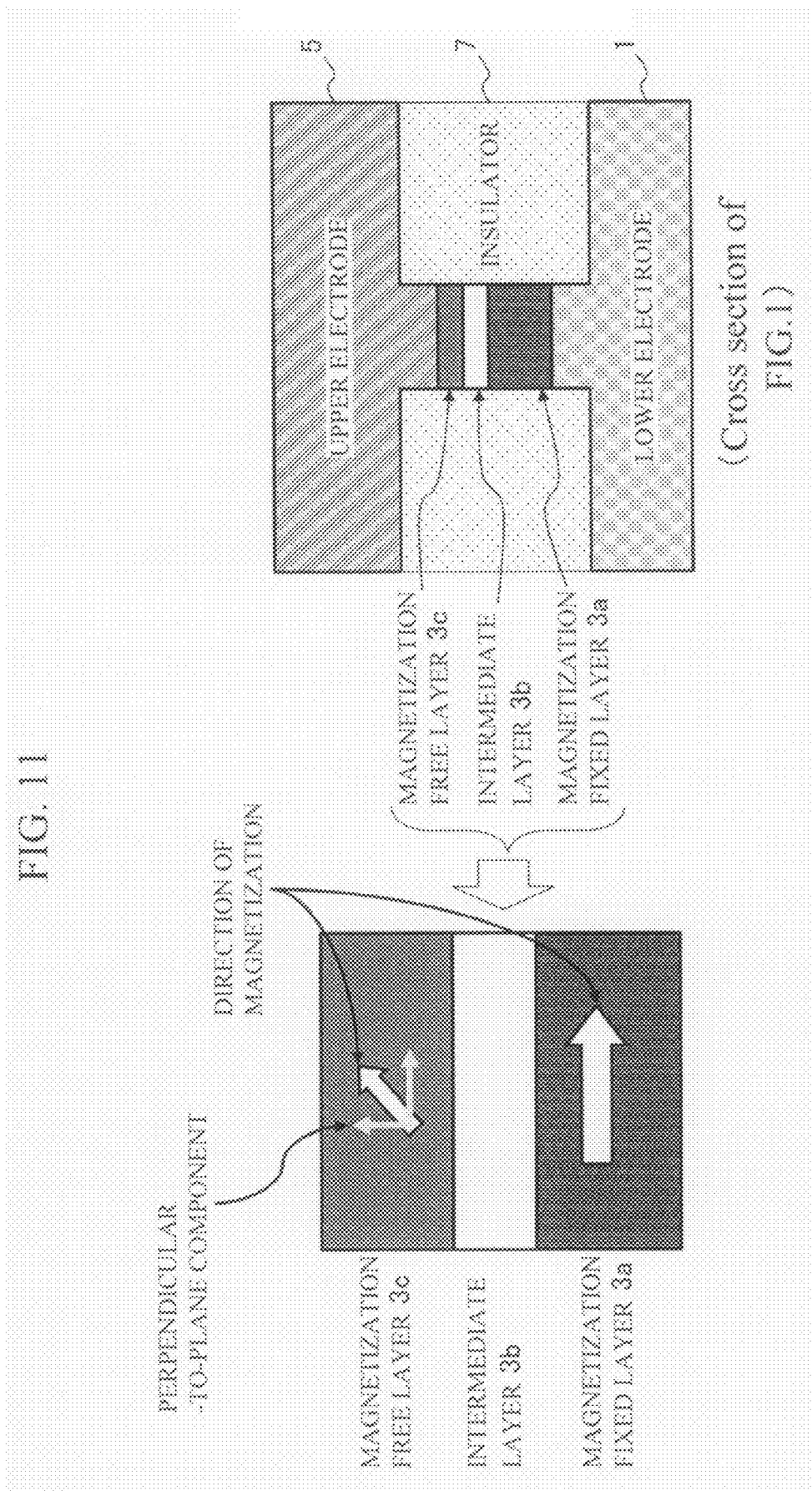
FIG. 11 shows an enlarged cross section of the magnetoresistance element portion, showing an example of configuration where the magnetization vector of the magnetization free layer has a component (perpendicular-to-plane component) perpendicular to the magnetization free layer and the magnetization fixed layer.

In order to improve the oscillation efficiency of the microwave oscillating element of the present embodiment, a method can be employed whereby the magnetization vector of the magnetization free layer 3c in the magnetoresistance element is provided with a component (perpendicular-to-plane component) perpendicular to a plane (film plane) parallel to the two layers. When there is such magnetization component normal to the film plane, it is said that there is a perpendicular magnetic anisotropy. In FIG. 11 showing the present example, the magnetization free layer 3c, intermediate layer 3b, and magnetization fixed layer 3a of the cross section of FIG. 1 shown on the right are clearly shown on the left. As a method to achieve the magnetization arrangement of FIG. 11, crystalline magnetic anisotropy may be used. For example, it is possible to impart perpendicular magnetic anisotropy by using a platinum-iron alloy, platinum-cobalt alloy, palladium-iron alloy, rare earth, or an alloy containing rare earth in the magnetization free layer. Alternatively, perpendicular magnetic anisotropy can also be imparted by using a cobalt/palladium multilayer film in the magnetic free layer. It is also possible to improve oscillation efficiency by providing the magnetization fixed layer with perpendicular magnetic anisotropy, or by providing both the magnetization free layer and the magnetization fixed layer with perpendicular magnetic anisotropy.

The principle for enhancing oscillation efficiency is the same as the principle for improving the detection efficiency of the microwave detecting element of the present invention. Therefore, it is possible to improve the detection efficiency of the microwave detecting element by providing the magnetization free layer and/or the magnetization fixed layer with perpendicular magnetic anisotropy.

Example 8

The microwave oscillating element of the present embodiment is based on an oscillation principle whereby a spin-polarized current (where the spins are polarized after passing through the magnetization fixed layer) is caused to flow through the magnetization free layer so as to impart torque to the spins in the magnetization free layer in order to produce resonance. In this microwave generating element, the oscillation frequency is proportional to the DC bias current, and the lower limit of oscillation frequency is generally determined by the critical current value (to be hereafter referred to as $I_{co}$) of current induced magnetization reversal. Thus, the oscillation frequency can be lowered by reducing the critical current. Hereafter, methods for lowering the frequency of the microwave oscillating element of the invention are described.

Figure 14:
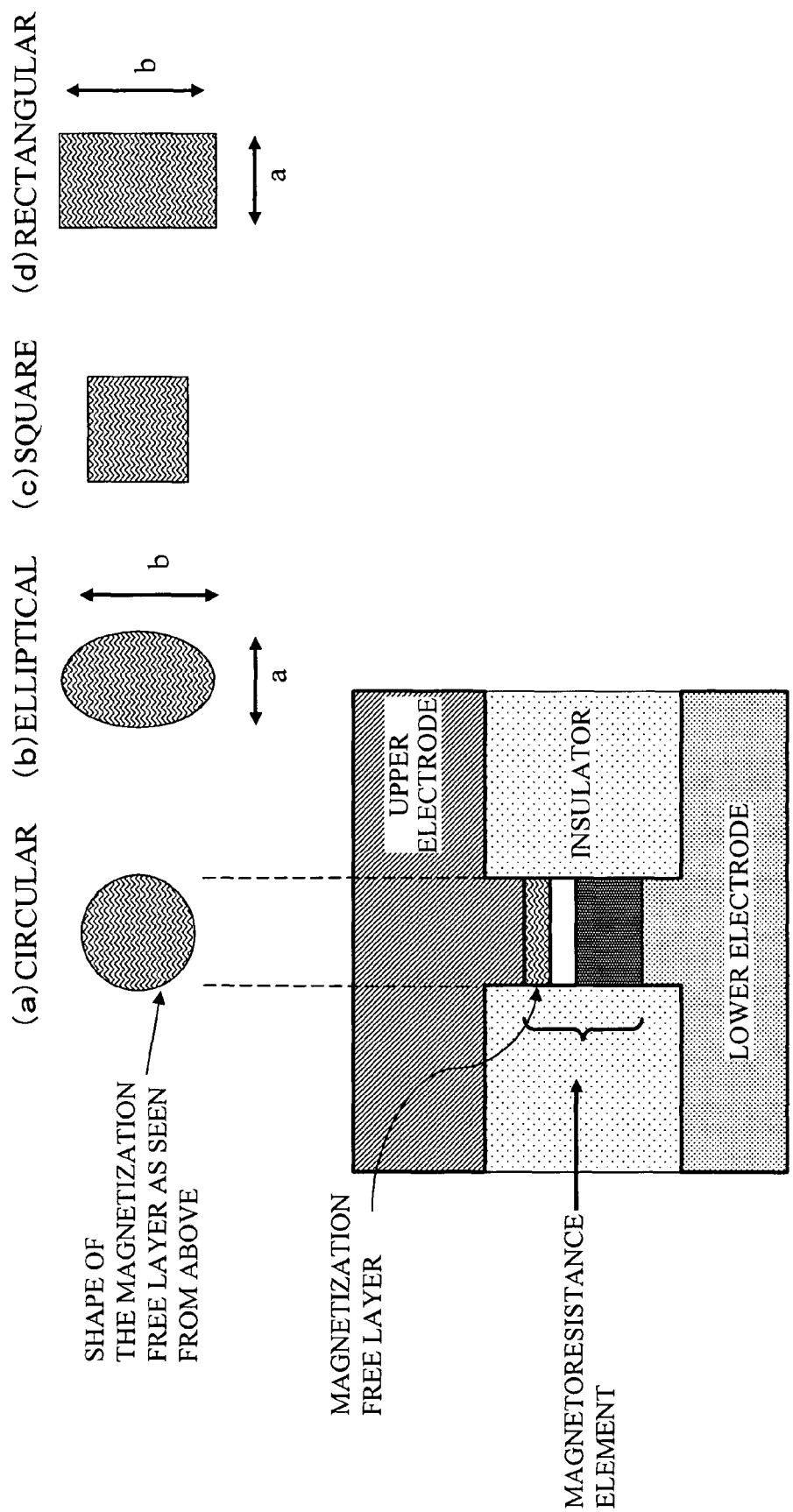
FIGS. 14 (*a*) to (*d*) show example of preferred shapes of the magnetization free layer.

(1) The magnetic anisotropy of the magnetization free layer is reduced. More specifically, the magnetization free layer is shaped such that the demagnetizing field in the magnetization free layer becomes uniform. Planar shapes such that the demagnetizing field becomes ideally uniform include a circle and an ellipse; from the viewpoint of ease of manufacture, the shape may be a square or a rectangle, for example. Examples of the planar shape of the element are shown in FIG. 14 (a) to (d). In order to cause the element to oscillate efficiently, its aspect ratio is preferably 3 or lower. The "aspect ratio" herein refers to the ratio of the long side to the short side (or the major axis to the minor axis). If the aspect ratio is large, the shape magnetic anisotropy in the magnetization free layer becomes large, resulting in a decrease in oscillation efficiency.

(2) A substance with small magnetization is used in the magnetization free layer. In this case, it is only necessary that the magnetization of the magnetization free layer as a whole becomes smaller. Therefore, the magnetization in the magnetization free layer may be reduced by, for example: providing a component distribution in the magnetization free layer; providing a multi-layer structure; or providing a multi-layer structure having antiferromagnetic coupling.

(3) A substance having a perpendicular-to-plane component magnetization is used in the magnetization fixed layer and/or the magnetization free layer.

(4) A substance with a small magnetic relaxation constant (damping factor) is used in the magnetic free layer.

By using any or a desired combination of the above methods, the oscillation frequency of the microwave oscillating element can be lowered.

Example 9

The microwave oscillating element of the present embodiment utilizes the Peltier effect in the element in order to reduce Joule heating during oscillation. The Peltier effect is the phenomenon in which heat is generated (or absorbed) at an interface between different materials when a current flows through the interface, depending on the difference of the thermoelectric power of the materials forming the interface. Since the amount of heat generated (or absorbed) is proportional to the current value, generation of heat is reversed to absorption of heat (or vice versa) when the current direction is reversed.

In the microwave generating element of the invention, oscillation is produced by providing a DC bias current to the magnetoresistance element. Furthermore, in the microwave detecting element of the invention, the resonance frequency (frequency to be detected) can be varied by providing a DC bias current to the magnetoresistance element. Since the cross-sectional area of the magnetoresistance element is very small (on the order of 100 nm square), the bias current required for oscillation or detection (on the order of several mA) that is caused to flow has a very large current density (i.e., values greater than at least $10^6$ A/cm$^2$), which could possibly lead to the deterioration or destruction of the element due to Joule heating.

Meanwhile, the inventors had found that a cooling effect is exhibited by a metal junction of a structure (referred to as a "CPP structure") similar to that of the magnetoresistance element of the invention, on the basis of the Peltier effect (refer to a paper by A. Fukushima et al., Jpn. J. Appl. Phys., vol. 44, pp. L12-14). As discussed in the referenced paper, in the CPP structure, a cooling effect due to current can be expressed at a CPP portion (where the width is narrowest in the element) when the materials of the upper electrode and the lower electrode are combined as mentioned below. This effect can be applied to the microwave generating element or the microwave detecting element of the invention.

The heat absorption amount Q due to the Peltier effect is given by $$Q=(Sb-Sa)\times T\times I$$

where Sa is the thermoelectric power (also referred to as the Seebeck coefficient) of the material of the upper electrode, Sb is the thermoelectric power of the material of the lower electrode, T is the absolute temperature, and I is current. Since Q is proportional to the current, heat absorption is switched at the interface to heat generation when the direction of the current is reversed.

In order to maximize the efficiency of heat absorption, desirably there is as much difference as possible between the thermoelectric power of the upper electrode and that of the lower electrode, and a combination of their materials is adopted such that heat absorption occurs in the direction of the operating current used in the oscillator or the detector.

Specifically, among the elemental metal elements that are conventionally used, the best results are obtained by using cobalt in the lower electrode and chromium in the upper electrode because the signs of their Seebeck coefficients are opposite and their absolute values are large.

Figure 12:
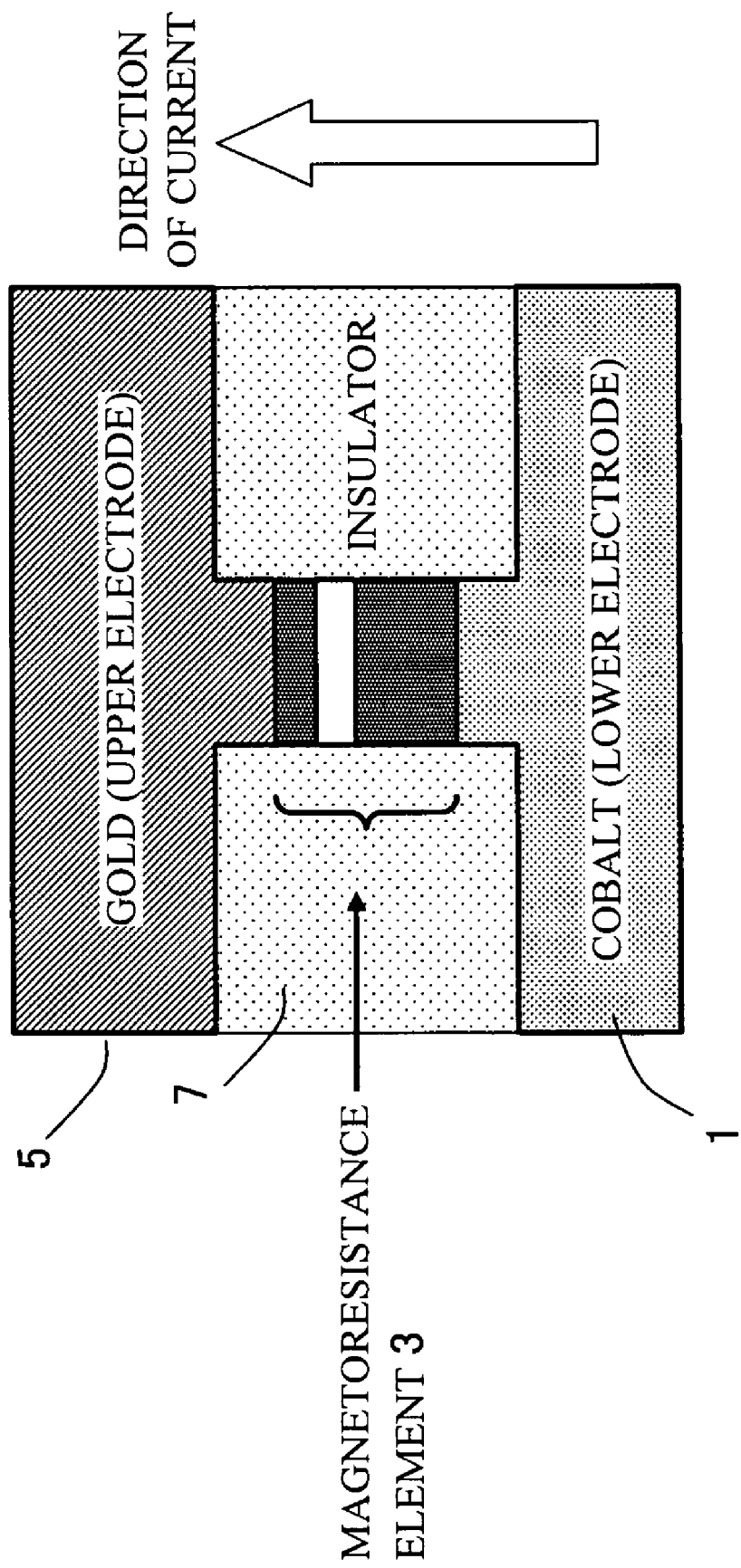
FIG. 12 shows an example of the element structure in which a current cooling effect (Peltier effect) is expressed at the magnetoresistance element portion based on a combination of the upper electrode and the lower electrode upon flow of a current.

FIG. 12 shows an example of the configuration of the magnetoresistance element of the microwave oscillating element of the invention, in which gold is used in the upper electrode 5 and cobalt is used in the lower electrode 1 (which may be the same as the magnetization fixed layer). This configuration provides a Peltier cooling effect by which Joule heating at the magnetoresistance element portion is reduced. In the configuration of FIG. 12, when the current flows in the direction from the lower electrode 1 to the upper electrode 5 (as indicated by the white arrow), the cooling effect is produced. In the combination of gold-cobalt, a cooling effect of several tens of μW is produced when the current value is several of mA. Desirably, a combination of materials is selected such that the difference between the upper electrode and the lower electrode in thermoelectric power becomes large. Specifically, in the arrangement where the operating current flows from the lower electrode to the upper electrode, the lower electrode should be made of a material such that its thermoelectric power has a positive sign and is large (such as a metal element having a negative and large thermoelectric power, such as cobalt or nickel, or an N-type semiconductor such as BiTe); the upper electrode should be made of a material having a smaller thermoelectric power than the lower electrode, or having an opposite sign (such as: a metal element such as gold, copper, platinum, titanium, or aluminum; a metal element having a positive and large thermoelectric power, such as chromium, iron, europium; or a P-type semiconductor such as BiSb). By using this element structure, the detection element can be improved in reliability and operating life.

Thus, by adopting a combination of materials for the upper electrode 5 and the lower electrode 1 that are in contact with the magnetoresistance element such that a current cooling effect can be exhibited, the amount of heat generated during oscillation in the case of an oscillator or during detection in the case of a detector can be reduced.

Example 10

Figure 15:
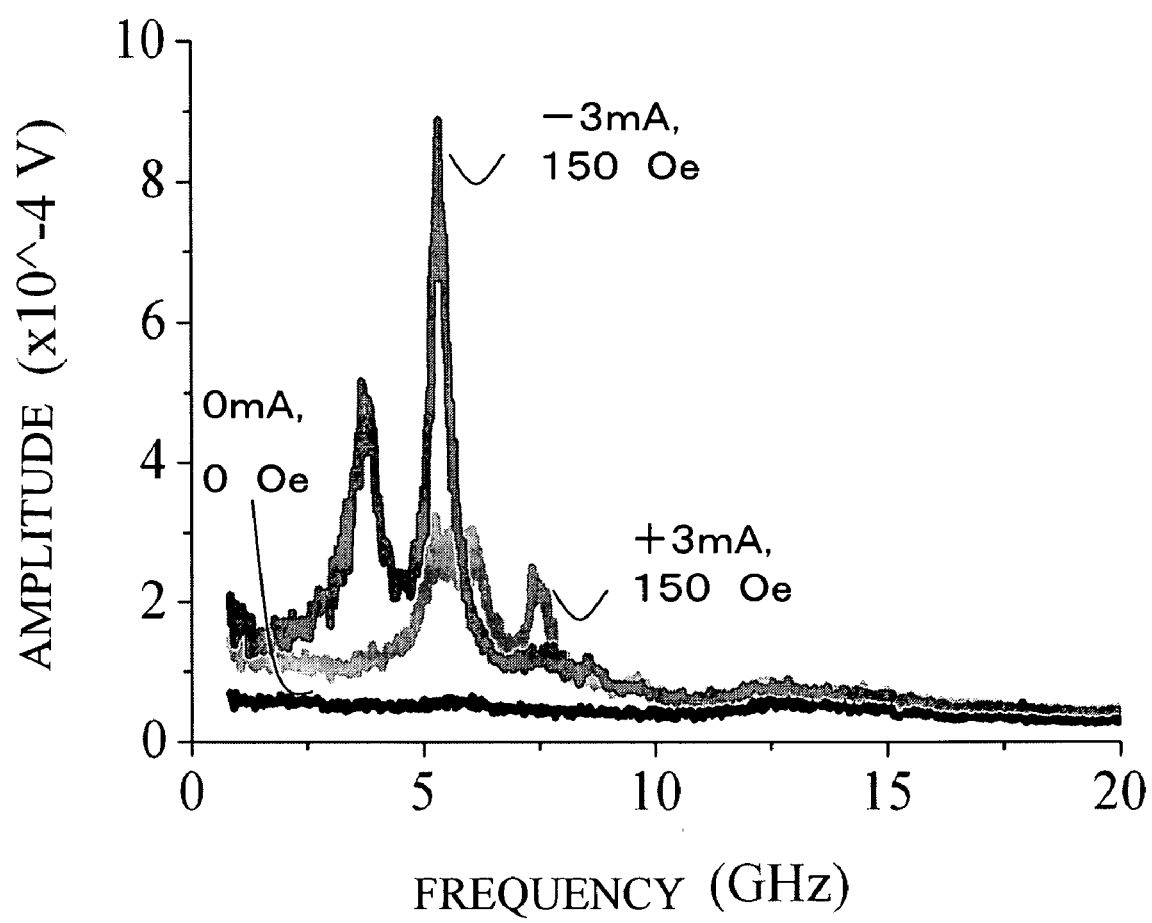
FIG. 15 shows the results of an experiment according to an embodiment of the invention, in which, using a tunneling magnetoresistance element having a MgO tunnel barrier as a ferromagnetic-multilayer-film magnetoresistance element, a DC bias current was provided to excite microwave oscillation.

In the following, experimental results based on the invention are described as Example 10. FIG. 15 shows the result of an experiment in which, using a tunneling magnetoresistance element having an MgO tunnel barrier as a ferromagnetic-multilayer-film magnetoresistance element, microwave oscillation was excited by providing a DC bias current.

With regard to the structure of the tunneling magnetoresistance element used in the experiment, the magnetization fixed layer was comprised of an antiferromagnetic coupling film of cobalt-iron-boron and ruthenium; the intermediate layer was comprised of magnesium oxide; and the magnetization free layer was comprised of cobalt-iron-boron. The magnetization free layer had the dimensions of 100 nm×200 nm square in a planar direction and a thickness of 3 nm. The resistance value was approximately 100Ω when the magnetization fixed layer and the magnetization free layer were in a parallel magnetization state and approximately 200Ω when they were in an antiparallel state. A DC bias current was caused to flow in this element, and the frequency dependency of the intensity of microwave that was generated was measured with a spectrum analyzer. The results are shown in FIG. 15.

As shown in FIG. 15, clear oscillation signals are obtained in a region of frequencies from 3 GHz to 8 GHz. A comparison with the data in the case of no bias current (0 mA) clearly shows that these oscillation signals are due to microwave oscillation caused by the DC current. In particular, the peak near 6 GHz at the bias current of −3 mA is prominent, where the S/N ratio is 100 or more, indicating a significant accuracy of measurement.

Regarding the signal intensities, the values are not definitive because the vertical axis of the graph of FIG. 15 shows data after amplification (about 40 dBm) of the signal from the element; however, it can be concluded that an output of approximately 1 nW was obtained at the approximate peak (−3 mA at 6 GHz). This value is approximately 100 times the experimental values of microwave oscillation based on a GMR element that have so far been reported, thus indicating a very large value. That a plurality of oscillation peaks are seen is due to the use of the same material in the antiferromagnetic coupling film as the magnetization free layer, which produces similar resonance phenomena.

Theoretically, an even larger oscillation signal (on the order of the square of the magnetoresistance ratio, i.e., several thousand times greater) should be obtained. In this experiment, the oscillation intensity is lower than the expected value; it is speculated that this is due to not all of the spins in the magnetization free layer moving in a coherent (tuned) manner. It is possible to increase the oscillation intensity by modifying the configuration, shape, and the like of the element in the future.

INDUSTRIAL APPLICABILITY

The microwave generating element and the microwave detecting element according to the invention can be applied in electronic circuits (such as oscillators, detectors, etc.) that utilize microwave in information communications industries.

The invention claimed is:

1. A strip line integrated microwave generating element comprising:
   (1) a strip line having a signal electrode and a ground electrode, and
   (2) the microwave generating element having a magnetic tunnel junction structure which comprises a magnetization fixed layer formed of a ferromagnetic material; a MgO tunnel barrier layer; and a magnetization free layer formed of a ferromagnetic material,
   the microwave generating element being smaller than the electrodes and being mounted on a part of the signal electrode or the ground electrode,
   the magnetization fixed layer of the microwave generating element being in contact with either one of the signal electrode and the ground electrode while the magnetization free layer of the element being in contact with the other, MR ratio of the microwave generating element being of 100% or more, a resistance value of the microwave generating element being from 50Ω to 300Ω, the resistance of the microwave generating element matching with an impedance of the strip line, and a size of the microwave generating element being such that the magnetization free layer can form a single magnetic domain and being 200 nm square or smaller in cross-sectional area in a layer plan direction.

2. The strip line integrated microwave detecting element according to claim 1, wherein the MgO layer is formed of a polycrystal $MgO_x(0<x<1)$ having preferential orientation in the (001) crystal plane.

3. A microwave detecting element having a magnetic tunnel junction structure which comprises:

a magnetization fixed layer formed of a ferromagnetic material;

a tunnel barrier layer; and a magnetization free layer formed of a ferromagnetic material, wherein a magnetization vector of the magnetization free layer or that of the magnetization fixed layer has a component perpendicular to a plane parallel to the magnetization free layer or the magnetization fixed layer, respectively, so that a detectable frequency of the microwave becomes low.

4. A microwave transmission line integrated microwave detecting element comprising:

(1) a microwave transmission line having a signal electrode and a ground electrode, and (2) the microwave detecting element having a magnetic tunnel junction structure which comprises a magnetization fixed layer formed of a ferromagnetic material; a tunnel barrier layer; and a magnetization free layer formed of a ferromagnetic material, wherein the microwave detecting element is smaller than the electrodes and is mounted on a part of the signal electrode or the ground electrode, and the magnetization fixed layer of the microwave detecting element is in contact with either one of the signal electrode and the ground electrode while the magnetization free layer of the microwave detecting element is in contact with the other.

5. The microwave transmission line integrated microwave detecting element according to claim 4, wherein the microwave detecting element is smaller than the electrodes so that a ratio of change in impedance of the microwave transmission line after an installation of the microwave detecting element to the impedance before the installation thereof is one-thousandth or less.

6. The microwave transmission line integrated microwave detecting element according to claim 4, wherein the microwave transmission line is a strip line.

7. The microwave transmission line integrated microwave detecting element according to claim 4, wherein the electrode in contact with the magnetization free layer of the microwave detecting element comprises a nonmagnetic material.

* * * * *

UNITED STATES PATENT AND TRADEMARK OFFICE
CERTIFICATE OF CORRECTION

| | | |
|---|---|---|
| PATENT NO. | : 7,764,136 B2 | Page 1 of 1 |
| APPLICATION NO. | : 11/886083 | |
| DATED | : July 27, 2010 | |
| INVENTOR(S) | : Suzuki et al. | |

It is certified that error appears in the above-identified patent and that said Letters Patent is hereby corrected as shown below:

Column 25, Line 16, please delete:

"detecting" and insert: -- generating --

Signed and Sealed this

Twenty-first Day of December, 2010

David J. Kappos
*Director of the United States Patent and Trademark Office*